United States Patent
Matsuda

(10) Patent No.: US 9,234,921 B2
(45) Date of Patent: Jan. 12, 2016

(54) STORAGE DEVICE, CONNECTION DEVICE, AND STORAGE CONTROL METHOD FOR MEASURING ELECTRIC POWER CONSUMED IN A CONTROL UNIT AND PLURALITY OF MEMORY DEVICES

(71) Applicant: FUJITSU LIMITED, Kawasaki-shi, Kanagawa (JP)

(72) Inventor: Shinnosuke Matsuda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 392 days.

(21) Appl. No.: 13/860,905

(22) Filed: Apr. 11, 2013

(65) Prior Publication Data
US 2014/0003180 A1    Jan. 2, 2014

(30) Foreign Application Priority Data

Jun. 29, 2012  (JP) .................................. 2012-146827

(51) Int. Cl.
*G01R 21/00* (2006.01)
*G11C 5/14* (2006.01)
*G11B 5/012* (2006.01)

(52) U.S. Cl.
CPC ................ *G01R 21/00* (2013.01); *G11B 5/012* (2013.01); *G11C 5/14* (2013.01)

(58) Field of Classification Search
CPC ..................................................... G06F 1/3203

USPC ........................................................ 713/320
See application file for complete search history.

(56) References Cited

U.S. PATENT DOCUMENTS

| | | | |
|---|---|---|---|
| 6,944,084 B2 * | 9/2005 | Wilcox .......................... | 365/226 |
| 7,543,108 B2 * | 6/2009 | Kakihara et al. .............. | 711/112 |
| 8,892,917 B2 * | 11/2014 | Sukegawa ...................... | 713/320 |
| 2005/0210304 A1 * | 9/2005 | Hartung et al. ............... | 713/320 |
| 2007/0079063 A1 | 4/2007 | Mizuno | |
| 2007/0294552 A1 | 12/2007 | Kakihara et al. | |
| 2011/0219248 A1 * | 9/2011 | Cho et al. ...................... | 713/323 |

FOREIGN PATENT DOCUMENTS

| | | |
|---|---|---|
| JP | 2007-102409 | 4/2007 |
| JP | 2008-3719 | 1/2008 |

\* cited by examiner

*Primary Examiner* — Suresh Suryawanshi
(74) *Attorney, Agent, or Firm* — Staas & Halsey LLP

(57) ABSTRACT

A storage device includes a first measurement unit, a second measurement unit, and a collection unit. The first measurement unit measures electric power consumed in each of a plurality of memory devices. The second measurement unit measures electric power consumed in a control unit controlling access from an information processing apparatus to the plurality of memory devices. The collection unit collects first information regarding the electric power measured by the first measurement unit and second information regarding the electric power measured by the second measurement unit.

5 Claims, 19 Drawing Sheets

FIG. 9

| TIME | POWER CONSUMPTION TABLE ||||||| AVERAGE PER MINUTE | ... |
|---|---|---|---|---|---|---|---|---|---|
| | AVERAGE PER SECOND (UNIT: W) ||||||| | |
| | ENC | MOD || HDD |||| | |
| | | #0 | #1 | #0 | #1 | ... | #23 | | |
| 0:00:00 | 150.0 | 30.0 | 25.0 | 8.1 | 8.1 | ... | 5.0 | ... | ... |
| 0:00:01 | 150.0 | 30.0 | 25.0 | 8.1 | 8.1 | ... | 5.0 | ... | ... |
| ... | ... | ... | ... | ... | ... | ... | ... | ... | ... |
| 11:59:59 | 160.0 | 25.0 | 20.0 | 10.0 | 9.0 | ... | 2.0 | ... | ... |
| 12:00:00 | 161.0 | 25.0 | 20.0 | 10.5 | 9.0 | ... | 2.0 | ... | ... |
| 12:00:01 | 160.0 | 25.0 | 20.0 | 10.5 | 9.0 | ... | 2.0 | ... | ... |
| ... | ... | ... | ... | ... | ... | ... | ... | ... | ... |
| 23:59:58 | 150.0 | 30.0 | 25.0 | 8.1 | 8.0 | ... | 5.0 | ... | ... |
| 23:59:59 | 150.0 | 30.0 | 25.0 | 8.1 | 8.0 | ... | 5.0 | ... | ... |

| POWER CONSUMPTION MONITORING FOR CE | POWER CONSUMPTION MONITORING FOR EACH CM | POWER CONSUMPTION MONITORING FOR EACH HDD | |
|---|---|---|---|
| ENC (PSU 160 SIDE) | MOD#0 | HDD#G0 | 0.5ms |
| | | HDD#G1 | 0.5ms |
| | | HDD#G2 | 0.5ms |
| | | HDD#G3 | 0.5ms |
| | MOD#1 | HDD#G0 | 0.5ms |
| | | HDD#G1 | 0.5ms |
| | | HDD#G2 | 0.5ms |
| | | HDD#G3 | 0.5ms |
| FLASH WRITE — wait | wait | wait | 1.0ms |
| ENC (PSU107 SIDE) | MOD#0 | HDD#G0 | 0.5ms |
| | | HDD#G1 | 0.5ms |
| | | HDD#G2 | 0.5ms |
| | | HDD#G3 | 0.5ms |
| | MOD#1 | HDD#G0 | 0.5ms |
| | | HDD#G1 | 0.5ms |
| | | HDD#G2 | 0.5ms |
| | | HDD#G3 | 0.5ms |
| FLASH WRITE — wait | wait | wait | 1.0ms |

10 ms IN TOTAL (1 CYCLE)

FIG. 17

| OPERATION MODE THRESHOLD VALUE TABLE ||||
|---|---|---|---|
| CLASSIFICATION | OPERATION MODE | IO LOAD FACTOR | POWER CONSUMPTION |
| HDD | RUN | 12% OR MORE | 7.0 W OR MORE |
| | IDLE | LESS THAN 12% | 4.0 W OR MORE AND LESS THAN 7.0 W |
| | ECO-mode | LESS THAN 12% | 0 W OR MORE AND LESS THAN 3.0 W |
| | Power-OFF | 0% | 0W |
| CM (IOM) | RUN | 5% OR MORE | 25 W OR MORE |
| | IDLE | LESS THAN 5% | 10 W OR MORE AND LESS THAN 25 W |
| | ECO-mode | LESS THAN 5% | LESS THAN 10 W |

POWER CONSUMPTION COMPARISON TABLE 800

| DEVICE | CLASSIFICATION | NUMBER | IO LOAD FACTOR (%) | POWER CONSUMPTION (W) | PRESENT OPERATION MODE | CHANGED OPERATION MODE | CHANGED POWER CONSUMPTION (W) |
|---|---|---|---|---|---|---|---|
| CE | HDD | 0 | 75 | 8.1 | RUN | RUN | 8.1 |
| | | 1 | 100 | 8.1 | RUN | RUN | 8.1 |
| | | ... | ... | ... | ... | ... | ... |
| | | 6 | 10 | 5.0 | IDLE | ECO-mode | 2.0 |
| | | 7 | 5 | 5.0 | IDLE | ECO-mode | 2.0 |
| | | ... | ... | ... | ... | ... | ... |
| | | 15 | 5 | 2.0 | ECO-mode | Power-OFF | 0 |
| | | 16 | 0 | 2.0 | ECO-mode | Power-OFF | 0 |
| | | ... | ... | ... | ... | ... | ... |
| | MOD | 0 | 50 | 30 | RUN | RUN | 30 |
| | | 1 | 0 | 15 | IDLE | ECO-mode | 10 |
| SUM TOTAL | | – | – | 150 | – | – | 100 |

STORAGE DEVICE, CONNECTION DEVICE, AND STORAGE CONTROL METHOD FOR MEASURING ELECTRIC POWER CONSUMED IN A CONTROL UNIT AND PLURALITY OF MEMORY DEVICES

CROSS-REFERENCE TO RELATED APPLICATION

This application is based upon and claims the benefit of priority of the prior Japanese Patent Application No. 2012-146827, filed on Jun. 29, 2012, the entire contents of which are incorporated herein by reference.

FIELD

The embodiments discussed herein are related to a storage device, a connection device, and a storage control method.

BACKGROUND

Currently, so as to record large amounts of data used in an information processing system, a storage device capable of housing a plurality of memory devices is used. As the memory device, for example, a hard disk drive (HDD), a solid state drive (SSD), or the like is used. The storage device includes a control module. The control module controls data access from an information processing apparatus (a computer or the like) to the plurality of memory devices. For example, the storage device may also construct redundant arrays of independent disks (RAID) using a plurality of memory devices. By using the RAID, it may be possible to achieve an increase in the speed of data access or an increase in the degree of reliability of data storage.

In some cases, electric power consumed in a storage device is monitored. For example, there is a proposal in which the power consumption value is calculated for each enclosure including a fan, a plurality of disk drives, a main controller, and the like. In this proposal, by performing control so that the calculated power consumption value becomes less than or equal to a predetermined allowable value of electric power and a difference between the power consumption value and the allowable value becomes desirably small, performance is improved while the power consumption value does not exceed the allowable value. There is also a proposal in which the power saving mode of a controller is changed in accordance with the load of each component of the controller inputting and outputting data to a disk device.

Japanese Laid-open Patent Publication No. 2008-3719 and Japanese Laid-open Patent Publication No. 2007-102409 disclose related techniques.

In a storage device, electric power consumed by a control module and a plurality of memory devices have not been acquired individually. Therefore, there is a problem that it is not easy to finely monitor power consumption.

SUMMARY

According to an aspect of the present invention, provided is a storage device including a first measurement unit, a second measurement unit, and a collection unit. The first measurement unit measures electric power consumed in each of a plurality of memory devices. The second measurement unit measures electric power consumed in a control unit controlling access from an information processing apparatus to the plurality of memory devices. The collection unit collects first information regarding the electric power measured by the first measurement unit and second information regarding the electric power measured by the second measurement unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a diagram illustrating an example of a power consumption table according to a second embodiment;

FIG. 13 is a diagram illustrating an example of switching a monitoring target in one cycle according to a second embodiment;

FIG. 17 is a diagram illustrating an example of an operation mode threshold value table according to a third embodiment;

FIG. 19 is a diagram illustrating an example of a power consumption comparison table according to a third embodiment.

DESCRIPTION OF EMBODIMENTS

Hereinafter, the embodiments will be described with reference to drawings.

First Embodiment

Figure 1:
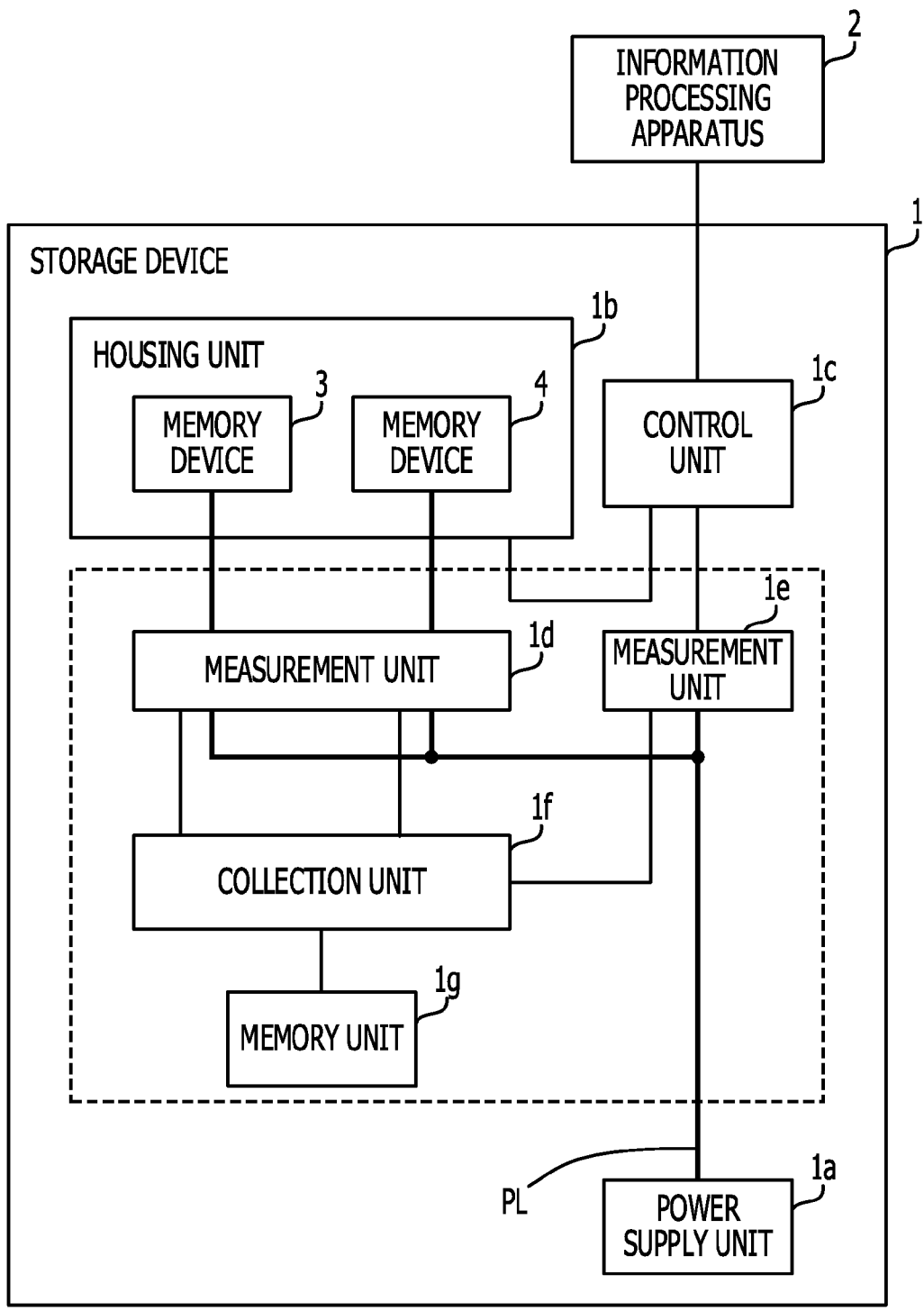
FIG. 1 is a diagram illustrating a storage device according to a first embodiment.

FIG. 1 is a diagram illustrating a storage device according to a first embodiment. A storage device 1 is capable of housing a plurality of memory devices. The storage device 1 is connected to an information processing apparatus 2 through a network. The storage device 1 includes a power supply unit 1a, a housing unit 1b, a control unit 1c, measurement units 1d and 1e, a collection unit 1f, and a memory unit 1g.

The power supply unit is supplies electric power used for causing the individual units and the memory devices in the storage device 1 to operate. The power supply unit is supplies electric power supplied from, for example, an uninterruptible power supply, a commercial power source, or the like, to the individual units and the memory devices through a power supply line PL. The power supply line PL is a wiring line, used for supplying electric power and provided within the storage device 1.

The housing unit 1b is capable of housing a plurality of memory devices. The housing unit 1b houses memory devices 3 and 4. The memory devices 3 and 4 are, for example, HDDs, SSDs, or the like.

The control unit 1c controls data access from the information processing apparatus 2 to the memory devices 3 and 4.

The measurement unit 1d measures electric power (simply referred to as power consumption) consumed in each of the memory devices 3 and 4. For example, the power supply line PL includes lines branched out from a main line so as to supply electric power to the individual memory devices 3 and 4. For example, by measuring a current and a voltage in a line serving the corresponding branch destination and multiplying the current by the voltage, the measurement unit 1d measures power consumption in each of the memory devices 3 and 4.

The measurement unit 1e measures electric power consumed in the control unit 1c. For example, the power supply line PL includes a line branched out from the main line so as to supply electric power to the control unit 1c. For example, by measuring a current and a voltage in a line serving the corresponding branch destination and multiplying the current by the voltage, the measurement unit 1e measures power consumption in the control unit 1c.

The collection unit 1f collects pieces of information regarding power consumption measured by the measurement units 1d and 1e. The collection unit 1f stores, in the memory unit 1g, the collected pieces of information regarding the power consumption. For example, the collection unit 1f periodically performs the collection of pieces of information from the measurement units 1d and 1e, the pieces of information regarding the power consumption. Using the information stored in the memory unit 1g, the collection unit 1f may also aggregate the power consumption of the memory devices 3 and 4 and the control unit 1c. The collection unit 1f may also provide, to the control unit 1c, the collected pieces of information regarding the power consumption, the aggregation result of the power consumption, or the like. The collection unit 1f may also provide these pieces of information to an information processing apparatus (not illustrated in FIG. 1) used for operation management (through a network, for example).

The memory unit 1g is a memory used for storing therein the information collected by the collection unit 1f or information generated by the collection unit 1f.

According to the storage device 1, electric power consumed in each of the memory devices 3 and 4 is measured by the measurement unit 1d. Electric power consumed in the control unit is measured by the measurement unit 1e. Information regarding the electric power measured by the measurement units 1d and 1e is collected by the collection unit 1f.

Accordingly, it may be possible to easily acquire the detailed information regarding the power consumption with respect to the storage device 1. Specifically, it may become possible to individually acquire electric power consumed by each of the control unit is and the memory devices 3 and 4. It may become possible to easily and finely monitor power consumption. For example, by acquiring information collected (or aggregated) by the collection unit 1f, the control unit 1c may understand the power consumption of the memory devices 3 and 4 and the control unit 1c. For example, it may also be possible for the control unit is to provide the acquired information regarding the power consumption, to an information processing apparatus performing operation management for the storage device 1.

In the manufacturing process of the storage device 1, the power supply unit 1a, the housing unit 1b, and the control unit is are assembled as individual devices in some cases. In that case, so as to assemble the storage device 1, a connection unit (connection device) is used as a component in the storage device 1 in some cases. The connection unit is used for connecting the power supply unit 1a, the memory devices 3 and 4, and the control unit is to each other. In this case, the power supply line PL and a data line are provided in the connection unit. The data line is used for performing data communication between individual units. The power supply unit is capable of supplying electric power to the memory devices 3 and 4 and the control unit is through the power supply line PL in the connection unit.

Therefore, the measurement units 1d and 1e, the collection unit 1f, and the memory unit 1g may be provided in the connection unit. By doing this, a function for collecting power consumption needs not be incorporated into the power supply unit 1a, the housing unit 1b, the control unit 1c, and the like. For example, by acquiring the information regarding the power consumption from the collection unit 1f, the control unit 1c may understand the power consumption of the memory devices 3 and 4 and the control unit 1c. Accordingly, it may be possible to easily implement, into the storage device 1, the function for monitoring electric power. In addition, it may become possible to supply, to a market, the connection unit as a component with the function for monitoring electric power.

Second Embodiment

Figure 2:
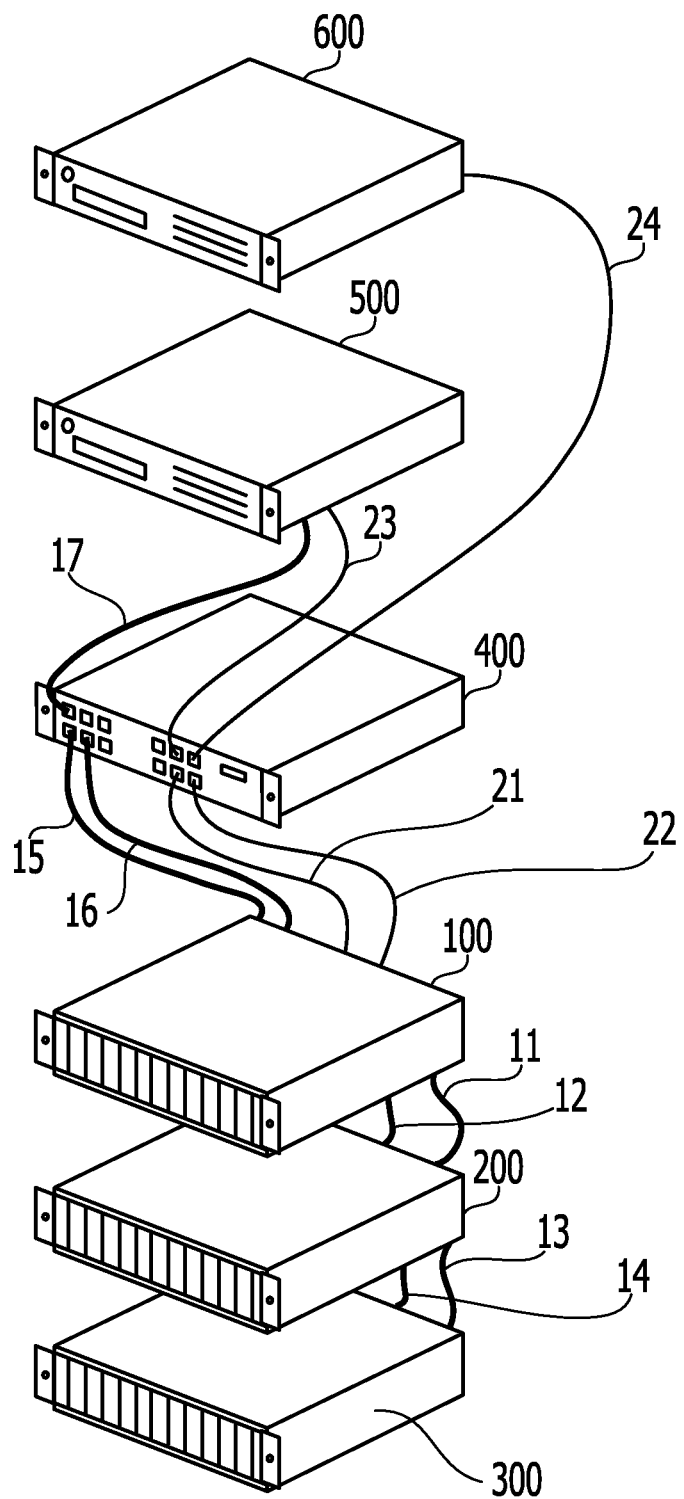
FIG. 2 is a diagram illustrating a storage system according to a second embodiment.

FIG. 2 is a diagram illustrating a storage system according to a second embodiment. The storage system according to the second embodiment includes a controller enclosure (CE) 100 and disk enclosures (DE) 200 and 300. The CE 100 and the DE 200 are connected to each other using cables 11 and 12. The DEs 200 and 300 are connected to each other using cables 13 and 14.

In addition, the CE 100 is connected to a switching device 400 using cables 15, 16, 21, and 22. An application server 500 is connected to the switching device 400 using cables 17 and 23. An operation management server 600 is connected to the switching device 400 using a cable 24.

As the cables 11, 12, 13, and 14, a cable (for example, a quad small form factor pluggable (QSFP) cable or the like) compliant with, for example, Ethernet (registered trademark), a fibre channel (FC), or infiniBand (registered trademark) may be used. As the cables 15 and 16, a cable compliant with, for example, the FC, a serial attached small computer system interface (SAS), an internet small computer system interface (iSCSI), a fibre channel over ethernet (FCoE), or the like may be used. The cables 11, 12, 13, 14, 15, 16, and 17 are used for communication by the application server 500 to execute data access to the CE 100 and the DEs 200 and 300.

As the cables 21, 22, 23, and 24, a cable compliant with, for example, Ethernet may be used. The cables 21, 22, 23, and 24 are used for communication by the operation management server 600 to perform operation management for the storage system.

The CE 100 is a storage device capable of housing a plurality of HDDs. In place of the HDDs or in conjunction with the HDDs, the CE 100 may also house a plurality of memory devices of another type such as an SSD. In accordance with an access request from the application server 500, the CE 100 may cause the DEs 200 and 300 to execute data access to the memory devices housed in the DEs 200 and 300.

The DEs 200 and 300 are storage devices capable of housing a plurality of HDDs. In place of the HDDs or in conjunction with the HDDs, the DEs 200 and 300 may also house a plurality of memory devices of another type such as an SSD. Data access in the DEs 200 and 300 is controlled by the CE 100. For example, the DE 200 performs writing or reading of data on the HDD housed in the DE 200 in accordance with an instruction from the CE 100. In addition, the DE 300 performs writing or reading of data on the HDD housed in the DE 300 in accordance with an instruction from the CE 100.

The switching device 400 is a relay device relaying communication between the CE 100, the application server 500, and the operation management server 600. The switching device 400 includes a plurality of ports used for connecting a plurality of types of cable.

The application server 500 is a server computer performing predetermined application processing using data stored in the storage system.

The operation management server 600 is a server computer performing operation management for the storage system. The operation management server 600 acquires the power consumption of the storage system. For example, using a simple network management protocol (SNMP), the operation management server 600 may acquire, from the CE 100, information (hereinafter, simply referred to as the information of power consumption in some cases) regarding the power consumption of the storage system.

For example, by operating the operation management server 600, the administrator of the storage system may inspect the state of the power consumption in the storage system. For example, the administrator may cause a display device connected to the operation management server 600 to display the state of the power consumption. As the state of the power consumption, present power consumption, previous power consumption, or the transition of power consumption may be considered. In response to the state of the power consumption, the operation management server 600 may also give notice to the administrator (for example, a notice that the power consumption has exceeded a threshold value). As the method of giving notice, transmitting an electronic mail or outputting a message to a display device may be considered.

The CE 100, the DEs 200 and 300, the switching device 400, the application server 500, and the operation management server 600 are housed in, for example, a rack. In this regard, however, each device may be a tower type.

Figure 3A:
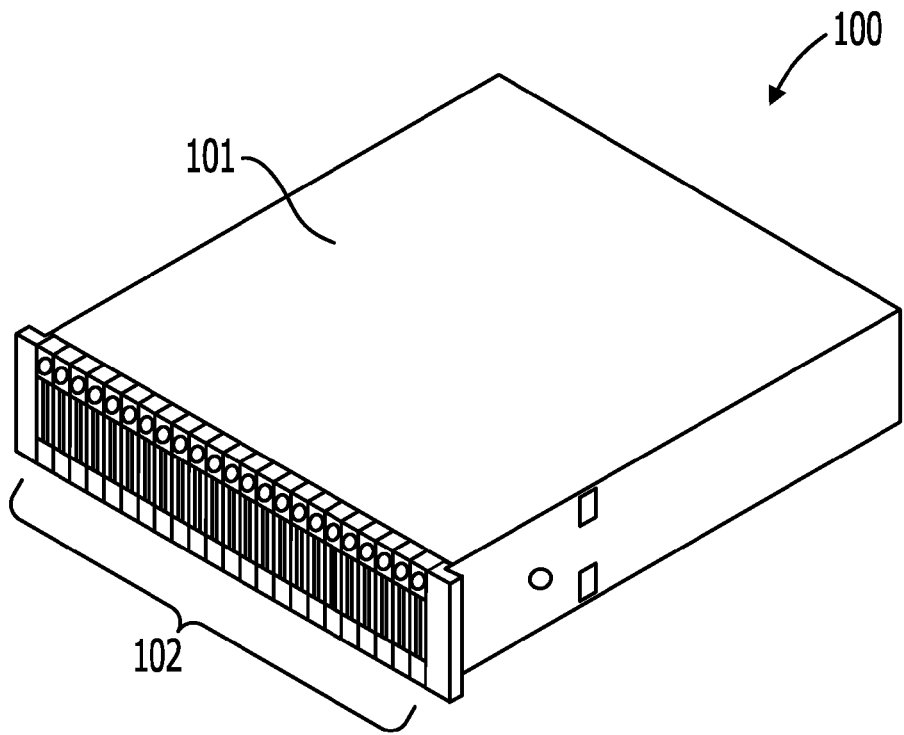
FIG. 3A and FIG. 3B are diagrams illustrating examples of external appearances of a CE according to a second embodiment.
Figure 3B:
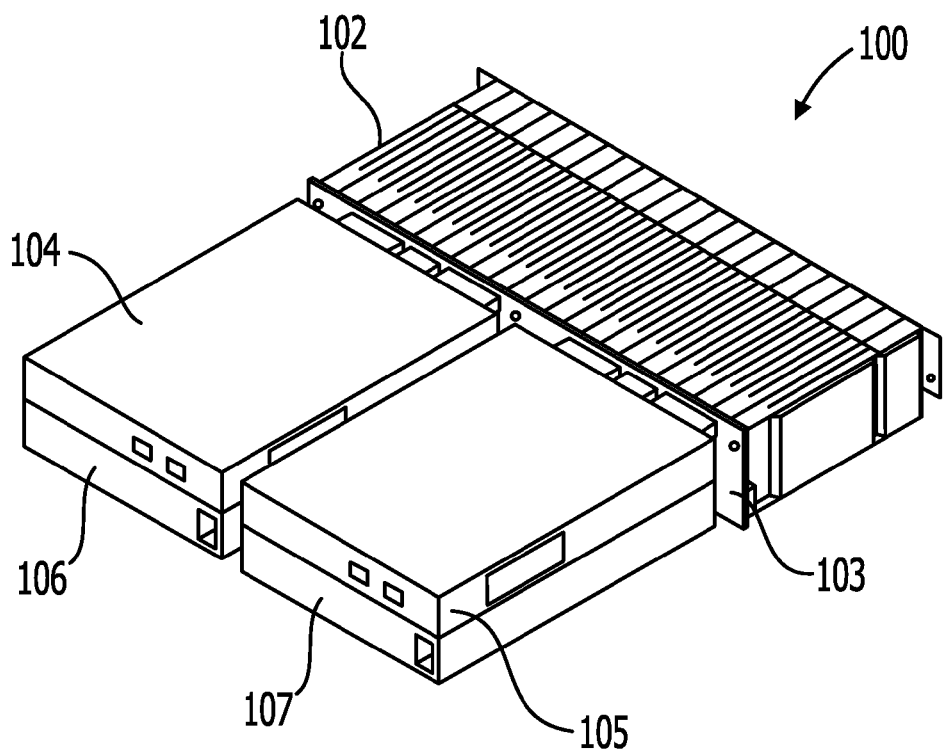

FIG. 3A and FIG. 3B are diagrams illustrating examples of external appearances of a CE according to the second embodiment. FIG. 3A is an example of the perspective view of the CE 100. The CE 100 includes an enclosure 101 and a housing unit 102.

The enclosure 101 houses the main body of the CE 100. The enclosure 101 is covered by an enclosure cover.

The housing unit 102 houses a plurality of HDDs. A portion of the housing unit 102 is housed within the enclosure 101. Another portion (housing portion) of the housing unit 102 is exposed on the outside of the enclosure 101 so that an administrator or a maintenance staff may perform working such as the exchange of an HDD. By inserting or extracting an HDD into or from the housing unit 102 from the outside, it may be possible to fit the HDD into the housing unit 102 or eject the HDD therefrom.

Here, it is assumed that a side where the housing unit 102 is exposed on the outside is the front surface side of the CE 100. In addition, it is assumed that a side opposite to the front surface side of the CE 100 is the back surface side thereof. In other words, FIG. 3A is a perspective view on the front surface side of the CE 100.

FIG. 3B is an example of a perspective view on the back surface side of the CE 100. In FIG. 3B, a case is exemplified where the enclosure cover of the enclosure 101 is removed. The CE 100 further includes a mid plane (MP) 103, controller modules (CMs) 104 and 105, and power supply units (PSUs) 106 and 107.

The MP 103 is a connection device used for connecting the housing unit 102, the CMs 104 and 105, and the PSUs 106 and 107 to each other. The MP 103 includes a line used for supplying electric power and a line used for data communication.

The CMs 104 and 105 are storage control devices controlling the entire CE 100. The CMs 104 and 105 perform communication with the application server 500 and access the HDDs housed in the CE 100 and the DEs 200 and 300. In addition, the CMs 104 and 105 collect information indicating the operational states of the CE 100 and the DEs 200 and 300. The CMs 104 and 105 perform communication with the operation management server 600, and provide, to the operation management server 600, the information indicating the operational states of the CE 100 and the DEs 200 and 300. The information indicating the operational states includes the information of power consumption.

It may be possible to cause both of the CMs 104 and 105 to operate in active states. For example, when both of the CMs 104 and 105 are caused to operate in active states, the CMs 104 and 105 share HDDs to be accessed. Specifically, access destinations are shared in such a manner that the CM 104 handles access to a portion of the plurality of HDDs housed in the housing unit 102 and the CM 105 handles access to another remaining portion thereof. When a failure has occurred in one CM, it may be possible to continue data access to all the HDDs by the other CM.

In addition, one of the CMs 104 and 105 may be caused to operate in an active state, and the other thereof may be caused to operate in a standby state. In a case where one CM is put into an active state, for example, when the CM 104 is in an active state, the CM 104 handles access to all the HDDs housed in the housing unit 102. In the following description, a case will be described where both of the CMs 104 and 105 are caused to operate in active states.

The PSUs 106 and 107 supply electric power used for causing the CE 100 to operate, to the entire CE 100 including the housing unit 102 (the HDDs housed in the housing unit 102 are included), the MP 103, and the CMs 104 and 105. It may be possible to supply electric power from both of the PSUs 106 and 107 to the individual units in the CE 100. In that case, the PSU 106 supplies electric power to one part of the plurality of HDDs housed in the housing unit 102 and the CM 104. In addition, the PSU 107 supplies electric power to the other part of the plurality of HDDs housed in the housing unit 102 and the CM 105. When a failure has occurred in one of the PSUs 106 and 107, it may also be considered that a normally functioning PSU continues supplying electric power to the entire CE 100 and hence the operation of the CE 100 is maintained.

The DEs 200 and 300 also have similar external appearances to the CE 100. The DEs 200 and 300 also turn out to have similar perspective views to the CE 100. In this regard, however, the main roles of the DEs 200 and 300 are to access the HDDs housed in the DEs 200 and 300 in accordance with an instruction from the CE 100. Therefore, the DEs 200 and 300 include modules called input output modules (IOMs), in place of CMs. The IOM is a module used for mainly performing reading and writing of data on the HDD.

Figure 4:
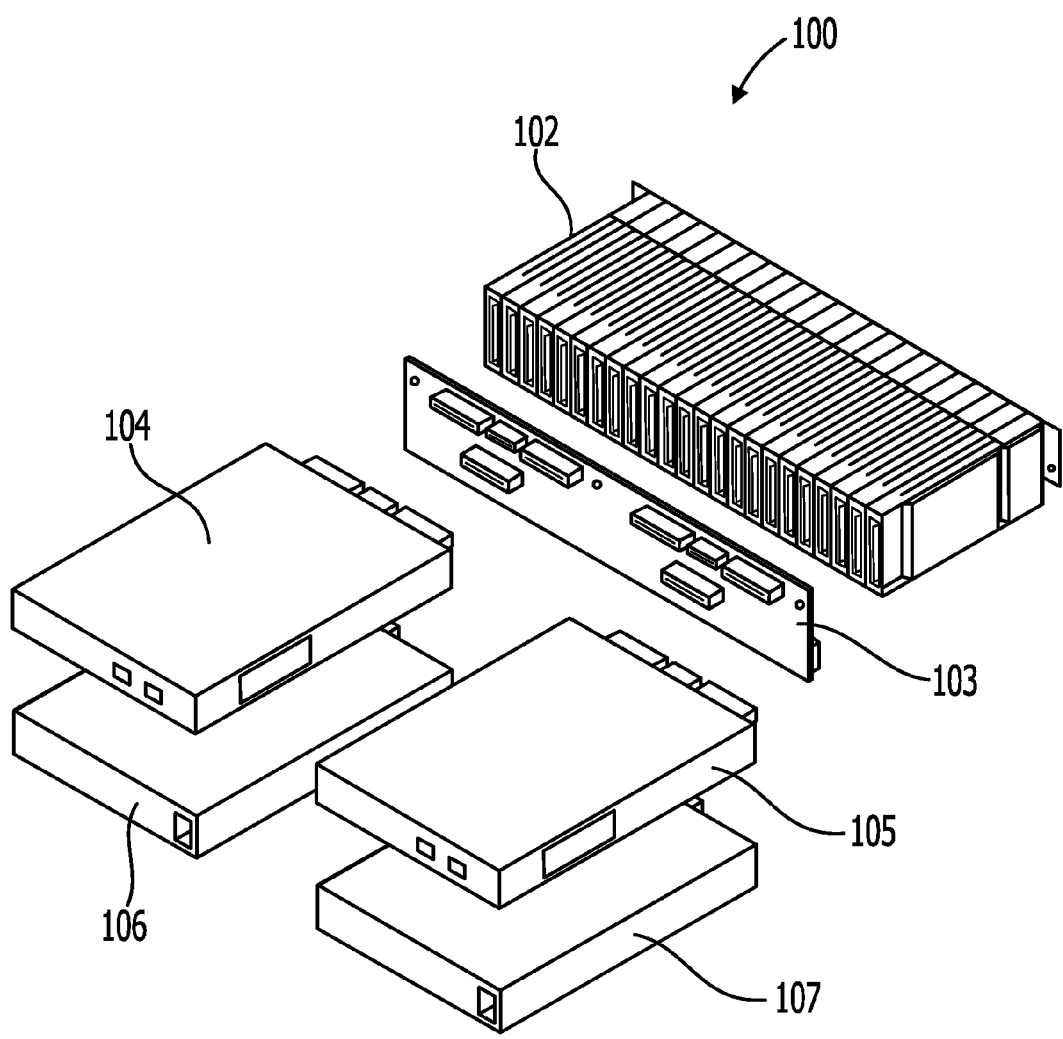
FIG. 4 is a diagram illustrating an example of an external appearance of a CE according to a second embodiment.

FIG. 4 is a diagram illustrating an example of an external appearance of a CE according to the second embodiment. FIG. 4 is an example of the exploded perspective view of the CE 100. In FIG. 4, a case is exemplified where the housing unit 102, the MP 103, the CMs 104 and 105, and the PSUs 106 and 107 in FIG. 3B are separated. The DEs 200 and 300 also turn out to have a similar exploded perspective view to the CE 100.

For example, each of the housing unit 102 and individual HDDs housed in the housing unit 102 includes a connector used for connecting to the MP 103. The MP 103 also includes connectors used for connecting to the housing unit 102 and the individual HDDs. By fitting the corresponding connectors provided in the housing unit 102, the individual HDDs, and the MP 103 into each other, the housing unit 102 and the individual HDDs housed in the housing unit 102 are connected to the MP 103. Through the connectors, the individual HDDs are connected to power supply lines and data lines in the MP 103.

The CMs 104 and 105 include connectors for connecting to the MP 103. The MP 103 also includes connectors for connecting to the CMs 104 and 105. By fitting the corresponding connectors provided in the MP 103 and the CMs 104 and 105 into each other, the CMs 104 and 105 are connected to the MP 103. Through the connectors, the CMs 104 and 105 are connected to power supply lines and data lines in the MP 103.

The PSUs 106 and 107 include connectors for connecting to the MP 103. The MP 103 also includes connectors for connecting to the PSUs 106 and 107. By fitting the corresponding connectors provided in the MP 103 and the PSUs 106 and 107 into each other, the PSUs 106 and 107 are connected to the MP 103. Through the connectors, the PSUs 106 and 107 are connected to power supply lines in the MP 103.

Figure 5:
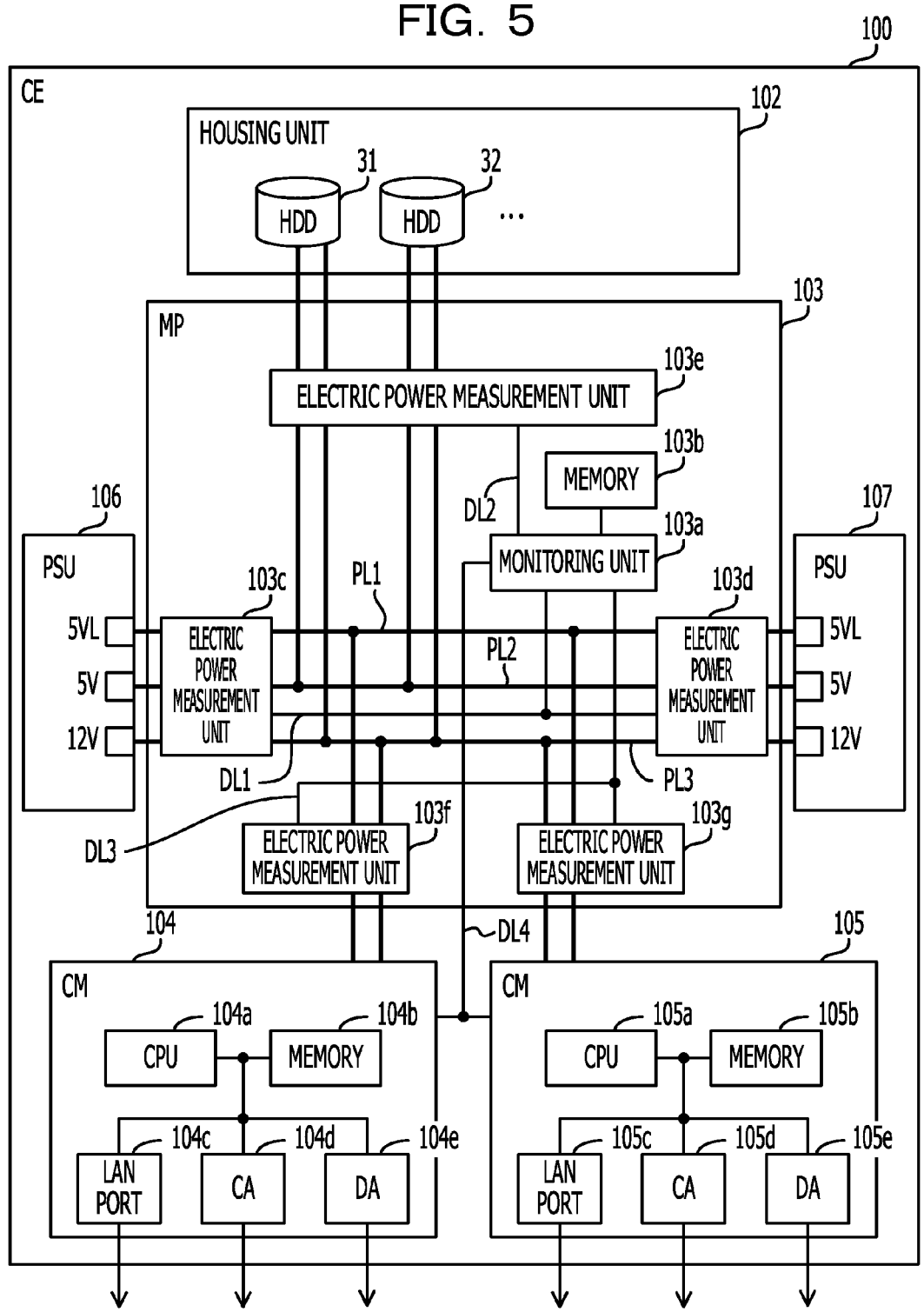
FIG. 5 is a diagram illustrating an example of hardware configuration of a CE according to a second embodiment.

FIG. 5 is a diagram illustrating an example of the hardware configuration of a CE according to the second embodiment. The housing unit 102 houses HDDs 31, 32, . . . . The PSUs 106 and 107 supply electric power with 5 VL, 5 V, and 12 V. The power sources of 5 VL and 12 V are used for driving the CMs 104 and 105. The power sources of 5 V and 12 V are used for driving the HDDs 31, 32, . . . .

The MP 103 includes power supply lines PL1, PL2, and PL3, data lines DL1, DL2, DL3, and DL4, a monitoring unit 103a, a memory 103b, and electric power measurement units 103c, 103d, 103e, 103f, and 103g.

The power supply line PL1 is used for supplying electric power of 5 VL. The power supply line PL2 is used for supplying electric power of 5 V. The power supply line PL3 is used for supplying electric power of 12 V.

The data line DL1 is used for input/output of data between the monitoring unit 103a and the electric power measurement units 103c and 103d. The data line DL2 is used for input/output of data between the monitoring unit 103a and the electric power measurement unit 103e. The data line DL3 is used for the input/output of data between the monitoring unit 103a and the electric power measurement units 103f and 103g. The data line DL4 is used for the input/output of data between the monitoring unit 103a and the CMs 104 and 105.

In FIG. 5, illustration of data lines used by the CMs 104 and 105 for accessing the HDDs 31, 32, . . . is omitted.

The monitoring unit 103a is an electronic circuit collecting the information of power consumption measured by the electric power measurement units 103c, 103d, 103e, 103f, and 103g. The monitoring unit 103a stores the collected information in the memory 103b. In addition, the monitoring unit 103a aggregates the information of power consumption, stored in the memory 103b. The monitoring unit 103a provides the information of power consumption to the CM 104 (or the CM 105). In addition, the monitoring unit 103a includes a real time clock (RTC) used for managing a time when the power consumption has been collected.

The monitoring unit 103a may also be, for example, an application specific integrated circuit (ASIC) or a field programmable gate array (FPGA), and may also be a general-purpose processor executing a program of firmware stored in the memory 103b. The monitoring unit 103a may be implemented using a plurality of ASICs. The monitoring unit 103a is an example of the collection unit in the first embodiment.

The memory 103b is a memory unit storing therein a program executed by the monitoring unit 103a and data used for processing. The memory 103b may be volatile or non-volatile memories. For example, the memory 103b stores therein the information of power consumption collected by the monitoring unit 103a and the information of an aggregation result obtained by the monitoring unit 103a aggregating the power consumption. The MP 103 may include a plurality of memories.

The electric power measurement unit 103c is measurement equipment measuring electric power supplied from the PSU 106 to the entire CE 100. The electric power measurement unit 103c is connected to the power supply lines PL1, PL2, and PL3. By measuring electric power supplied through the power supply lines PL1, PL2, and PL3, the electric power measurement unit 103c measures electric power supplied to the entire CE 100. For example, the electric power measurement unit 103c is provided in the vicinity of a connection portion between the MP 103 and the PSU 106 (within a connector, in a connector circumferential portion, or the like).

The electric power measurement unit 103d is measurement equipment measuring electric power supplied from the PSU 107 to the entire CE 100. The electric power measurement unit 103d measures electric power supplied to the entire CE 100, in the same way as the electric power measurement unit 103c. When electric power is simultaneously supplied from the PSUs 106 and 107, the sum of the power consumption measured in the electric power measurement units 103c and 103d corresponds to the power consumption of the entire CE 100. For example, the electric power measurement unit 103d is provided in the vicinity of a connection portion between the MP 103 and the PSU 107 (within a connector, in a connector circumferential portion, or the like).

The electric power measurement unit 103e is measurement equipment measuring electric power supplied from the PSUs 106 and 107 to each of the HDDs 31, 32, . . . . The electric power measurement unit 103e is connected to the power supply lines PL2 and PL3. By measuring electric power supplied through the power supply lines PL2 and PL3 (with respect to each HDD), the electric power measurement unit 103e measures electric power supplied to each HDD. For example, the electric power measurement unit 103e measures power consumption in the vicinity of a connection portion between the MP 103 and the HDDs 31, 32, . . . (within each connector used for connecting each HDD, in each connector circumferential portion, or the like). A plurality of the electric power measurement units 103e may be provided so as to be used for respective HDDs.

The electric power measurement unit 103f is measurement equipment measuring electric power supplied from the PSU 106 (or the PSU 107) to the CM 104. The electric power measurement unit 103f is connected to the power supply lines PL1 and PL3. By measuring electric power supplied through the power supply lines PL1 and PL3, the electric power measurement unit 103f measures electric power supplied to the CM 104. For example, the electric power measurement unit 103f is provided in the vicinity of a connection portion between the MP 103 and the CM 104 (within a connector, in a connector circumferential portion, or the like).

The electric power measurement unit 103g is measurement equipment measuring electric power supplied from the PSU 107 (or the PSU 106) to the CM 105. The electric power measurement unit 103g measures electric power supplied to the entire CM 105, in the same way as the electric power measurement unit 103f. For example, the electric power measurement unit 103g is provided in the vicinity of a connection portion between the MP 103 and the CM 105 (within a connector, in a connector circumferential portion, or the like).

For example, the electric power measurement units 103c, 103d, 103e, 103f, and 103g may measure the power consumption of each unit in the following way. By measuring the instantaneous values of a current and a voltage at a measurement point and multiplying the instantaneous values by each other, instantaneous electric power is measured. The average value of the instantaneous electric power sampled at predetermined time intervals is defined as power consumption.

The CM 104 includes a central processing unit (CPU) 104a, a memory 104b, a local area network (LAN) port 104c, a channel adaptor (CA) 104d, and a disk adaptor (DA) 104e.

The CPU 104a is a processor controlling the information processing of the CM 104. A plurality of processors may be provided in the CM 104, and a program may be distributed and executed.

The memory 104b is a memory unit storing therein a program of firmware executed by the CPU 104a and data used for processing. The memory 104b may be a non-volatile memory or a volatile memory. For example, the memory 104b may also be used as a cache memory temporarily storing therein target data at the time of reading or writing of data. In addition, for example, the memory 104b may also be used for storing therein data collected by the CPU 104a. The CM 104 may include a plurality of memories.

The LAN port 104c is a communication interface used for performing communication with the operation management server 600 through the switching device 400. The CM 104 may include a plurality of LAN ports.

The CA 104d is a communication interface used for performing communication with the application server 500 through the switching device 400. The CM 104 may also include a plurality of CAs.

The DA 104e is a communication interface used for performing communication with the DEs 200 and 300. The DA 104e may perform communication with the DE 300 through the DE 200. The CM 104 may include a plurality of DAs.

The CM 105 includes a CPU 105a, a memory 105b, a LAN port 105c, a CA 105d, and a DA 105e. Since the CPU 105a, the memory 105b, the LAN port 105c, the CA 105d, and the DA 105e are similar to the CPU 104a, the memory 104b, the LAN port 104c, the CA 104d, and the DA 104e, respectively, the descriptions thereof will be omitted.

Figure 6:
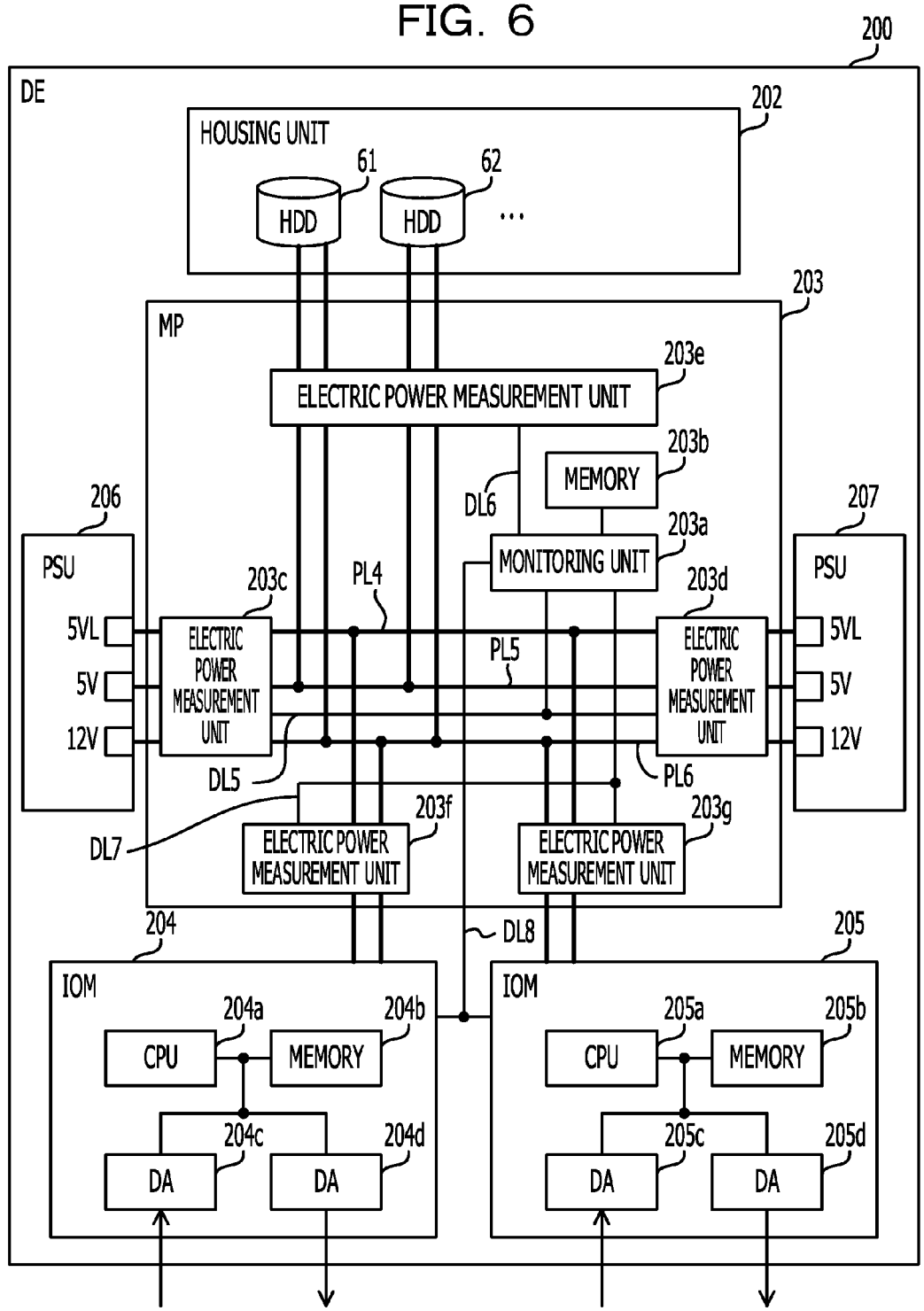
FIG. 6 is a diagram illustrating an example of hardware configuration of a DE according to a second embodiment.

FIG. 6 is a diagram illustrating an example of the hardware configuration of a DE according to the second embodiment.

The DE 200 includes a housing unit 202, an MP 203, IOMs 204 and 205, and PSUs 206 and 207. Each unit included in the DE 200 is similar to each corresponding unit included in the CE 100. Therefore, the descriptions of common subject matters will be omitted, and differences will be described. The DE 300 may be implemented using similar hardware configuration to the DE 200.

The housing unit 202 is similar to the housing unit 102. The housing unit 202 houses HDDs 61, 62, . . . . The PSUs 206 and 207 supply electric power with 5 VL, 5 V, and 12 V. The power sources of 5 VL and 12 V are used for driving the IOMs 204 and 205. The power sources of 5 V and 12 V are used for driving the HDDs 61, 62, . . . .

The MP 203 includes power supply lines PL4, PL5, and PL6, data lines DL5, DL6, DL7, and DL8, a monitoring unit 203a, a memory 203b, and electric power measurement units 203c, 203d, 203e, 203f, and 203g.

The power supply line PL4 is used for supplying electric power of 5 VL. The power supply line PL5 is used for supplying electric power of 5 V. The power supply line PL6 is used for supplying electric power of 12 V.

The data line DL5 is used for the input/output of data between the monitoring unit 203a and the electric power measurement units 203c and 203d. The data line DL6 is used for the input/output of data between the monitoring unit 203a and the electric power measurement unit 203e. The data line DL7 is used for the input/output of data between the monitoring unit 203a and the electric power measurement units 203f and 203g. The data line DL8 is used for the input/output of data between the monitoring unit 203a and the IOMs 204 and 205.

In FIG. 6, the illustration of data lines used by the IOMs 204 and 205 for accessing the HDDs 61, 62, . . . is omitted.

The monitoring unit 203a is an electronic circuit collecting the information of power consumption measured by the electric power measurement units 203c, 203d, 203e, 203f, and 203g. The monitoring unit 203a has a similar function to the monitoring unit 103a. The monitoring unit 203a aggregates and provides the information of power consumption to the IOM 204 (or the IOM 205).

The monitoring unit 203a may also be, for example, an ASIC or an FPGA, and may also be a general-purpose processor executing a program of firmware stored in the memory 103b. The monitoring unit 203a may be implemented using a plurality of ASICs. The monitoring unit 203a is also an example of the collection unit in the first embodiment.

The memory 203b is a memory unit storing therein a program executed by the monitoring unit 203a and data used for processing. Since the memory 203b is similar to the memory 103b, the description thereof will be omitted.

The electric power measurement unit 203c is measurement equipment measuring electric power supplied from the PSU 206 to the entire DE 200. The electric power measurement unit 203d is measurement equipment measuring electric power supplied from the PSU 207 to the entire DE 200. The electric power measurement unit 203e is measurement equipment measuring electric power supplied from the PSUs 206 and 207 to each of the HDDs 61, 62, . . . . The electric power measurement unit 203f is measurement equipment measuring electric power supplied from the PSU 206 (or the PSU 207) to the IOM 204. The electric power measurement unit 203g is measurement equipment measuring electric power supplied from the PSU 207 (or the PSU 206) to the IOM 205.

The descriptions of the electric power measurement units 203c, 203d, 203e, 203f, and 203g are similar to the descriptions of the electric power measurement units 103c, 103d, 103e, 103f, and 103g, respectively. Specifically, in the description of FIG. 5, the HDDs 31, 32, . . . may be deemed to be replaced with the HDDs 61, 62, . . . , respectively, the CMs 104 and 105 may be deemed to be replaced with the IOMs 204 and 205, respectively, and the PSUs 106 and 107 may be deemed to be replaced with the PSUs 206 and 207, respectively. In addition, in the description of FIG. 5, the power supply lines PL1, PL2, and PL3 may be deemed to be replaced with the power supply lines PL4, PL5, and PL6, respectively.

The IOM 204 includes a CPU 204a, a memory 204b, and DAs 204c and 204d. Since the CPU 204a, the memory 204b, and the DAs 204c and 204d are similar to the CPU 104a, the memory 104b, and the DA 104e, respectively, the descriptions thereof will be omitted. The DA 204c is connected to the CE 100 (for example, the DA 104e). The DA 204d is connected to the DE 300.

The IOM 205 includes a CPU 205a, a memory 205b, and DAs 205c and 205d. Since the CPU 205a, the memory 205b, and the DAs 205c and 205d are similar to the CPU 104a, the memory 104b, and the DA 104e, respectively, the descriptions thereof will be omitted. The DA 205c is connected to the CE 100 (for example, the DA 105e). The DA 205d is connected to the DE 300.

Figure 7:
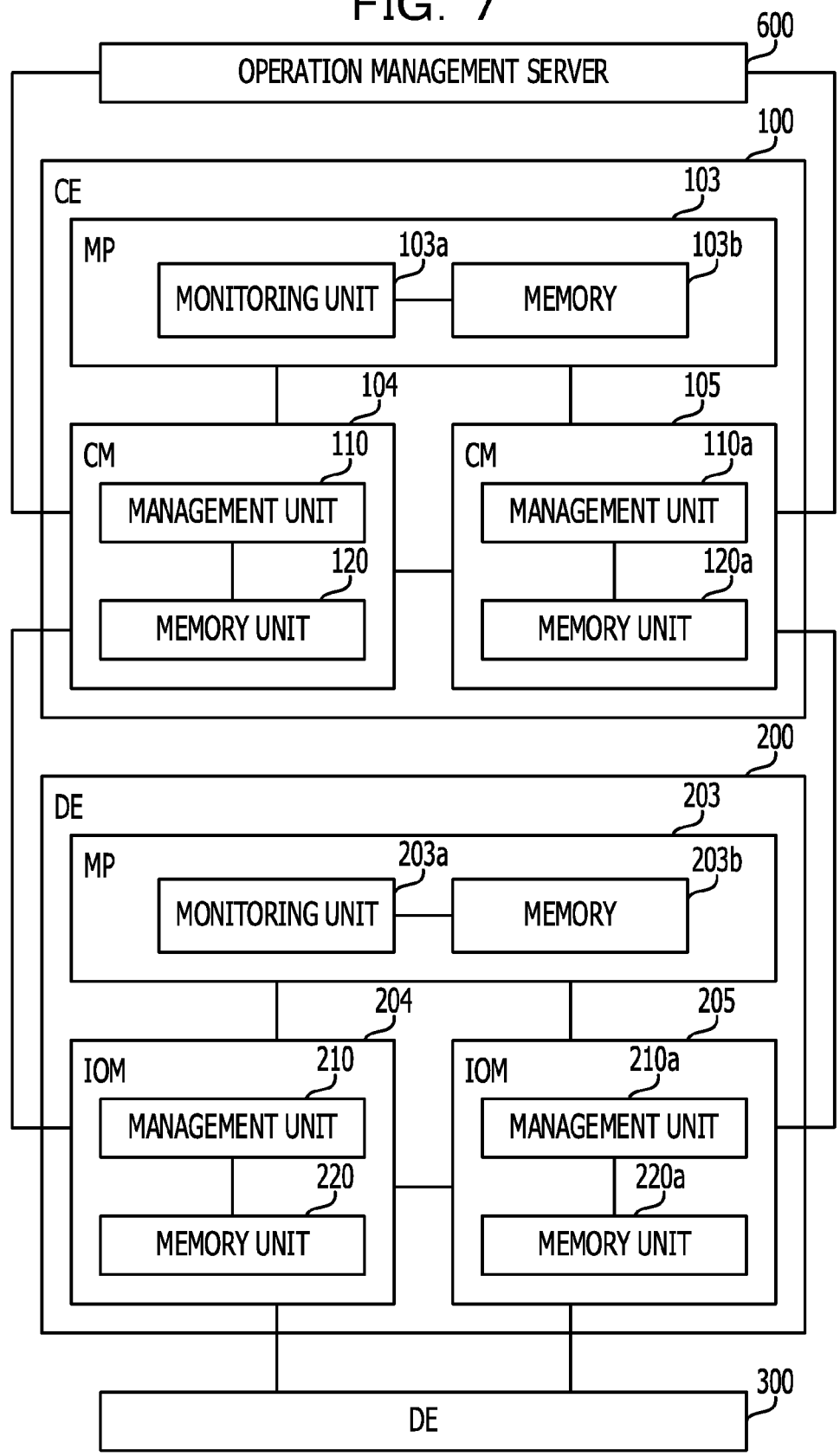
FIG. 7 is a diagram illustrating an example of functional configuration of a storage system according to a second embodiment.

FIG. 7 is a diagram illustrating an example of functional configuration of a storage system according to the second embodiment. The CM 104 includes a management unit 110 and a memory unit 120.

The management unit 110 acquires the information of power consumption collected by the monitoring unit 103a and the aggregation result of power consumption calculated by the monitoring unit 103a, and stores the acquired information and the acquired aggregation result in the memory unit 120. The management unit 110 acquires, from the IOM 204, the information of power consumption collected by the monitoring unit 203a and the aggregation result of power consumption calculated by the monitoring unit 203a, and stores the acquired information and the acquired aggregation result in the memory unit 120. Furthermore, in the same way, the management unit 110 also acquires, from the DE 300 through the IOM 204, the information of power consumption and the aggregation result of power consumption, and stores the acquired information and the acquired aggregation result in the memory unit 120. The management unit 110 provides, to the operation management server 600, the information stored in the memory unit 120.

The memory unit 120 stores therein data collected by the management unit 110. The memory unit 120 may be implemented using, for example, the memory 104b.

The CM 105 includes a management unit 110a and a memory unit 120a. Since the management unit 110a and the memory unit 120a are similar to the management unit 110 and the memory unit 120, respectively, the descriptions thereof will be omitted.

Here, one of the management units 110 and 110a collects the information of power consumption in the CE 100 and the DEs 200 and 300. The management units 110 and 110a are capable of communicating with each other, and the collection function of one of the management units 110 and 110a may be activated while the collection function of the other is inactivated. For example, when the management unit 110 is active, the management unit 110 collects the information of power consumption in the CE 100 and the DEs 200 and 300. When the management unit 110 does not operate owing to a failure or the like, the inactive management unit 110a is activated and performs collection of information as substitute for the management unit 110. In this regard, however, both of the management units 110 and 110a may be caused to collect the information of power consumption. In this case, one of the management units 110 and 110a may provide information to the operation management server 600.

The IOM 204 includes a management unit 210 and a memory unit 220.

The management unit 210 acquires the information of power consumption collected by the monitoring unit 203a and the aggregation result of power consumption calculated by the monitoring unit 203a, and stores the acquired information and the acquired aggregation result in the memory unit 220. The management unit 210 also acquires, from the DE 300, the information of power consumption collected by a monitoring unit included in the DE 300 and the aggregation result of power consumption calculated by the monitoring unit, and stores the acquired information and the acquired aggregation result in the memory unit 220. The management unit 210 provides, to the CE 100 (for example, the management unit 110), the information stored in the memory unit 220.

The memory unit 220 stores therein data collected by the management unit 210. The memory unit 220 may be implemented using, for example, the memory 204b.

The IOM 205 includes a management unit 210a and a memory unit 220a. Since the management unit 210a and the memory unit 220a are similar to the management unit 210 and the memory unit 220, respectively, the descriptions thereof will be omitted.

Here, in the same way as the management units 110 and 110a, one of the management units 210 and 210a collects the information of power consumption in the DEs 200 and 300. Alternatively, both of the management units 210 and 210a may be caused to collect the information of power consumption. In this case, one of the management units 210 and 210a may provide information to the CE 100.

In the following description, it is assumed that the management units 110 and 210 collect and provide the information of power consumption in the CE 100 and the DE 200. As for the DE 300, in the same way, it is assumed that one of the redundant management units collects the information of power consumption and the one management unit provides information to the management unit 210.

The functions of the management units 110, 110a, 210, and 210a may be fulfilled by the CPUs 104a, 105a, 204a, and 205a executing predetermined programs, respectively. Alternatively, the management units 110, 110a, 210, and 210a may also be electronic circuits such as FPGAs or ASICs provided in the CMs 104 and 105 and the IOMs 204 and 205 (may be provided as independent management units, separately from the CPUs).

The DE 300 also includes a management unit and a memory unit within an IOM, in the same way as the DE 200.

Figure 8:
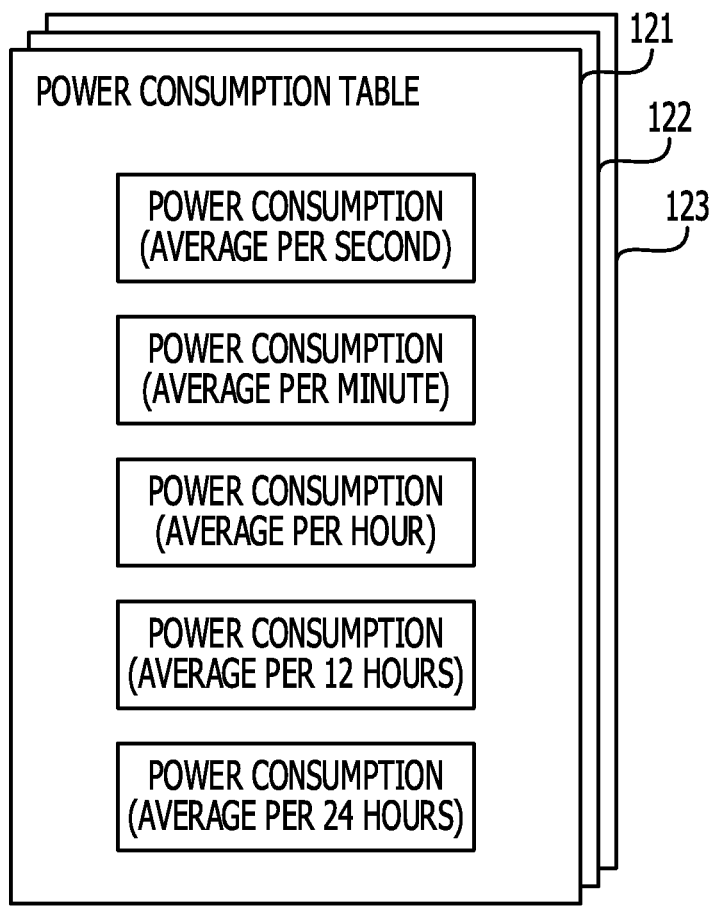
FIG. 8 is a diagram illustrating an example of a power consumption table according to a second embodiment.

FIG. 8 is a diagram illustrating an example of a power consumption table according to the second embodiment. A power consumption table 121 is a table where the information of power consumption regarding the CE 100 is registered. The power consumption table 121 is generated by the monitoring unit 103a and stored in the memory 103b. In addition, the power consumption table 121 is provided to the management unit 110 by the monitoring unit 103a, and is stored in the memory unit 120 by the management unit 110.

In the power consumption table 121, power consumption is registered for the CE, for each CM, and for each HDD. The power consumption registered in the power consumption table 121 is an average value for a predetermined time period. For example, an average value for one second, an average value for one minute, an average value for one hour, an average value for 12 hours, an average value for 24 hours, or the like may be registered. An average value for another time period such as 30 seconds, 30 minutes, 6 hours, or the like may also be acquired.

A power consumption table 122 is a table where the information of power consumption regarding the DE 200 is registered. The power consumption table 122 is generated by the monitoring unit 203a and stored in the memory 203b. In addition, the power consumption table 122 is provided to the management unit 210 by the monitoring unit 203a, and is stored in the memory unit 220 by the management unit 210. Furthermore, the power consumption table 122 is provided to the management unit 110 by the management unit 210, and is stored in the memory unit 120 by the management unit 110.

A power consumption table 123 is a table where the information of power consumption regarding the DE 300 is registered. In the same way as the power consumption table 122, the power consumption table 123 is also generated by a monitoring unit included in the DE 300. The power consumption table 123 is provided to the management unit 110 through the DE 200, and is stored in the memory unit 120 by the management unit 110.

In the same way as the power consumption table 121, in the power consumption tables 122 and 123, power consumption is registered for the CE, for each CM, and for each HDD. In the same way as the power consumption table 121, the power consumption registered in the power consumption tables 122 and 123 are average values for a predetermined time period. Next, the specific data structure of the power consumption table 121 will be exemplified.

FIG. 9 is a diagram illustrating an example of a power consumption table according to the second embodiment. The power consumption table 121 includes items of a "time", an "average per second", an "average per minute", . . . . The part abbreviated to " . . . " includes items indicating time units for which averages are obtained (in the above-mentioned example, an average per hour, an average per 12 hours, an average per 24 hours, or the like).

In the "time" item, a time at which power consumption is measured is registered. In the "average per second" item, the average value of power consumption for one second is registered for the CE, for each CM, and for each HDD. The registered value is represented in, for example, watts (W). For example, the "average per second" item is subdivided into an item of "ENC" (the starting characters of an enclosure), an item of "MOD" (the starting characters of a module), and an item of "HDD". In the "ENC" item, power consumption is registered for the CE. In the "MOD" item, power consumption is individually registered for each of the CMs 104 and 105. The identifier of the CM 104 is "MOD#0". The identifier of the CM 105 is "MOD#1". In the "HDD" item, power consumption is individually registered for each of the HDDs 31, 32, . . . . In FIG. 9, a case is exemplified where the 24 HDDs 31, 32, . . . are housed in the housing unit 102. The identifier of the HDD 31 is "HDD#0". The identifier of the HDD 32 is "HDD#1". The identifier of the 24th HDD is "HDD#23".

An item indicating another time unit such as an average per minute or an average per hour also includes each of "ENC" item, the "MOD" item, and the "HDD" item, in the same way as the items of an average per second. Power consumption is registered with respect to each of the "ENC" item, the "MOD" item, and the "HDD" item.

For example, in the power consumption table 121, information is registered in which the time is "0:00:00", the ENC is "150.0" (W), the MOD#0 is "30.0" (W), the MOD#1 is "25.0" (W), the HDD#0 is "8.1" (W), the HDD#1 is "8.1" (W), . . . , and the HDD#23 is "5.0" (W).

This indicates that the power consumption of the entire CE 100 is 150 W at the time of 0 hours, 0 minutes, and 0 seconds. It is indicated that, at the corresponding time, the power consumption of the CM 104 is 30 W and the power consumption of the CM 105 is 25 W. It is indicated that, at the corresponding time, the power consumption of the HDD 31 is 8.1 W, the power consumption of the HDD 32 is 8.1 W, and the power consumption of the 24th HDD is 5 W.

As for the "average per minute" item, the average value of the history of power consumption for latest 60 seconds is registered with respect to each of the "ENC" item, the "MOD" item, and the "HDD" item.

As for the "average per hour" item, in the same way, the average value of the history of power consumption for latest 60 minutes is registered with respect to each of the "ENC" item, the "MOD" item, and the "HDD" item. Also as for the "average per 12 hours" item and the "average per 24 hours" item, in the same way, the average values of the histories of power consumption for latest 12 hours and latest 24 hours are registered with respect to each of the "ENC" item, the "MOD" item, and the "HDD" item.

In the power consumption table 121, in addition to the time, a date may also be managed. In the power consumption table 121, only a history corresponding to latest 24 hours may be held. It is attributed to the reduction of the memory 103b. In that case, if the management unit 110 acquires the information of the power consumption table 121 from the monitoring unit 103a with a period shorter than 24 hours, it may be possible to avoid the failure of acquiring measured power consumption.

In addition, the power consumption tables 122 and 123 also have the same data structure as the power consumption table 121.

Next, a procedure for monitoring power consumption in such a storage system as described above will be described. While, in the following description, a procedure executed by the monitoring unit 103a will be mainly described, the monitoring unit 203a or a monitoring unit included in the DE 300 also monitors power consumption in a similar procedure.

Here, the monitoring unit 103a starts the following procedure with timing at which the monitoring function of the monitoring unit 103a is turned on, and terminates the procedure with timing at which the monitoring function is turned off. The turn-on/turn-off of the monitoring function is switchable, for example, from the operation management server 600 through the CM 104. Alternatively, the turn-on/turn-off of the monitoring function may be caused to be switchable in response to an operation performed on a predetermined operation unit provided in the operation panel of the CE 100 or the like.

The following procedure exemplifies a procedure to be executed with the period of 5 milliseconds (ms). In the example of the second embodiment, it is assumed that one cycle of the measurement of power consumption is 10 milliseconds. 5 milliseconds correspond to 0.5 cycles. First, an example of monitoring of power consumption for the CE will be described.

Figure 10:
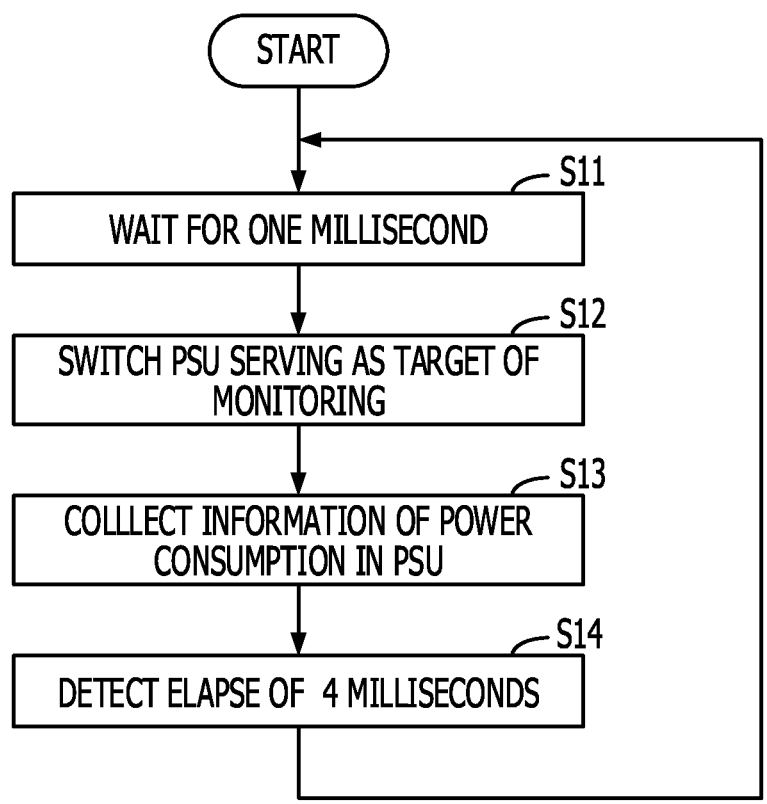
FIG. 10 is a flowchart illustrating an example of monitoring (for a CE) according to a second embodiment.

FIG. 10 is a flowchart illustrating an example of monitoring (for the CE) according to the second embodiment. Hereinafter, processing illustrated in FIG. 10 will be described in keeping with numbers.

(S11) The monitoring unit 103a waits for one millisecond. The waiting time of one millisecond inserted after the measurement of power consumption is also a time used for recording measured power consumption in the memory 103b (the same shall apply hereinafter).

(S12) The monitoring unit 103a switches a monitoring target PSU. For example, when a previous monitoring target is the PSU 107, a present monitoring target is switched to the PSU 106.

(S13) The monitoring unit 103a collects the information of power consumption measured in an electric power measurement unit on a PSU side of a present monitoring target, and stores the collected information of power consumption in the memory 103b. When the present monitoring target is the PSU 106, the information of power consumption is collected from the electric power measurement unit 103c. When the present monitoring target is the PSU 107, the information of power consumption is collected from the electric power measurement unit 103d.

(S14) When having detected that 4 milliseconds have elapsed from the completion of S11, the monitoring unit 103a transfers the processing to S11.

By executing the above-mentioned procedure with the period of 5 milliseconds, the monitoring unit 103a continuously collects the information of power consumption for the CE, from the electric power measurement units 103c and 103d.

The electric power measurement units 103c and 103d measure power consumption in direct currents. Therefore, in S13, on the basis of the alternating current/direct current (AC/DC) conversion efficiencies of the PSUs 106 and 107, the monitoring unit 103a may convert the power consumption collected from the electric power measurement units 103c and 103d to power consumption in alternating currents. For example, when the AC/DC conversion efficiency is 0.8, values obtained by dividing the power consumption collected from the electric power measurement units 103c and 103d by 0.8 are power consumption in alternating currents. If power consumption is preliminarily converted to power consumption in an alternating current by the monitoring unit 103a, the conversion need not be performed in the management unit 110, the operation management server 600, or the like.

Next, an example of monitoring of power consumption for each CM will be described.

Figure 11:
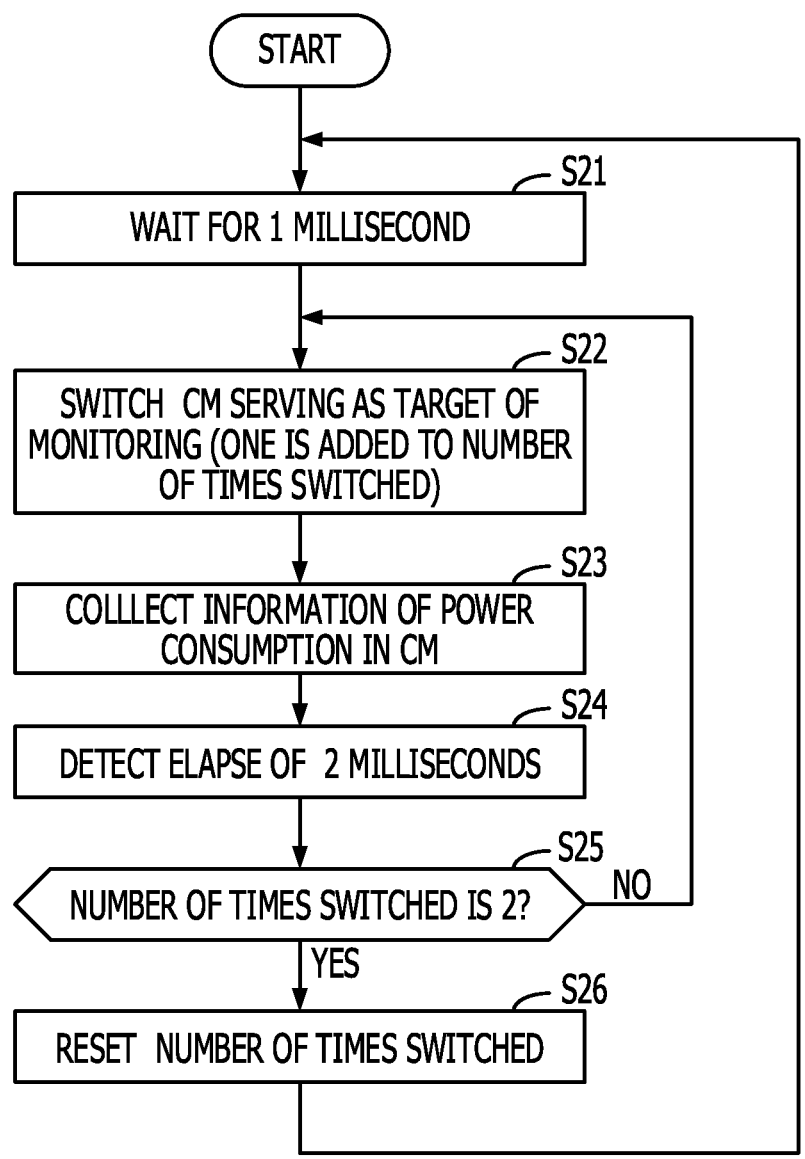
FIG. 11 is a flowchart illustrating an example of monitoring (for each CM) according to a second embodiment.

FIG. 11 is a flowchart illustrating an example of monitoring (for each CM) according to the second embodiment. Hereinafter, processing illustrated in FIG. 11 will be described in keeping with numbers.

(S21) The monitoring unit 103a waits for one millisecond.

(S22) The monitoring unit 103a switches a monitoring target CM. For example, when a previous monitoring target is the CM 105, a present monitoring target is switched to the CM 104. The monitoring unit 103a adds "1" to the number of times a monitoring target CM is switched.

(S23) The monitoring unit 103a collects the information of power consumption measured in an electric power measurement unit on a CM side of a present monitoring target, and stores the collected information of power consumption in the memory 103b. When the present monitoring target is the CM 104, the information of power consumption is collected from the electric power measurement unit 103f. When the present monitoring target is the CM 105, the information of power consumption is collected from the electric power measurement unit 103g.

(S24) When having detected that 2 milliseconds have elapsed from the start of S22, the monitoring unit 103a transfers the processing to S25.

(S25) The monitoring unit 103a determines whether or not the number of times a monitoring target CM is switched is "2". When the number of times a monitoring target CM is switched is "2", the processing is transferred to S26. When the number of times a monitoring target CM is switched is not "2", the processing is transferred to S22.

(S26) The monitoring unit 103a resets, to "0", the number of times a monitoring target CM is switched. Thereafter, the processing is transferred to S21.

By executing the above-mentioned procedure with the period of 5 milliseconds, the monitoring unit 103a continuously collects the information of power consumption for each CM, from the electric power measurement units 103f and 103g. In S23, the monitoring unit 103a may convert the power consumption collected from the electric power measurement units 103f and 103g to power consumption in alternating currents. The reason is similar to S13.

Next, an example of monitoring of power consumption for each HDD will be described.

Figure 12:
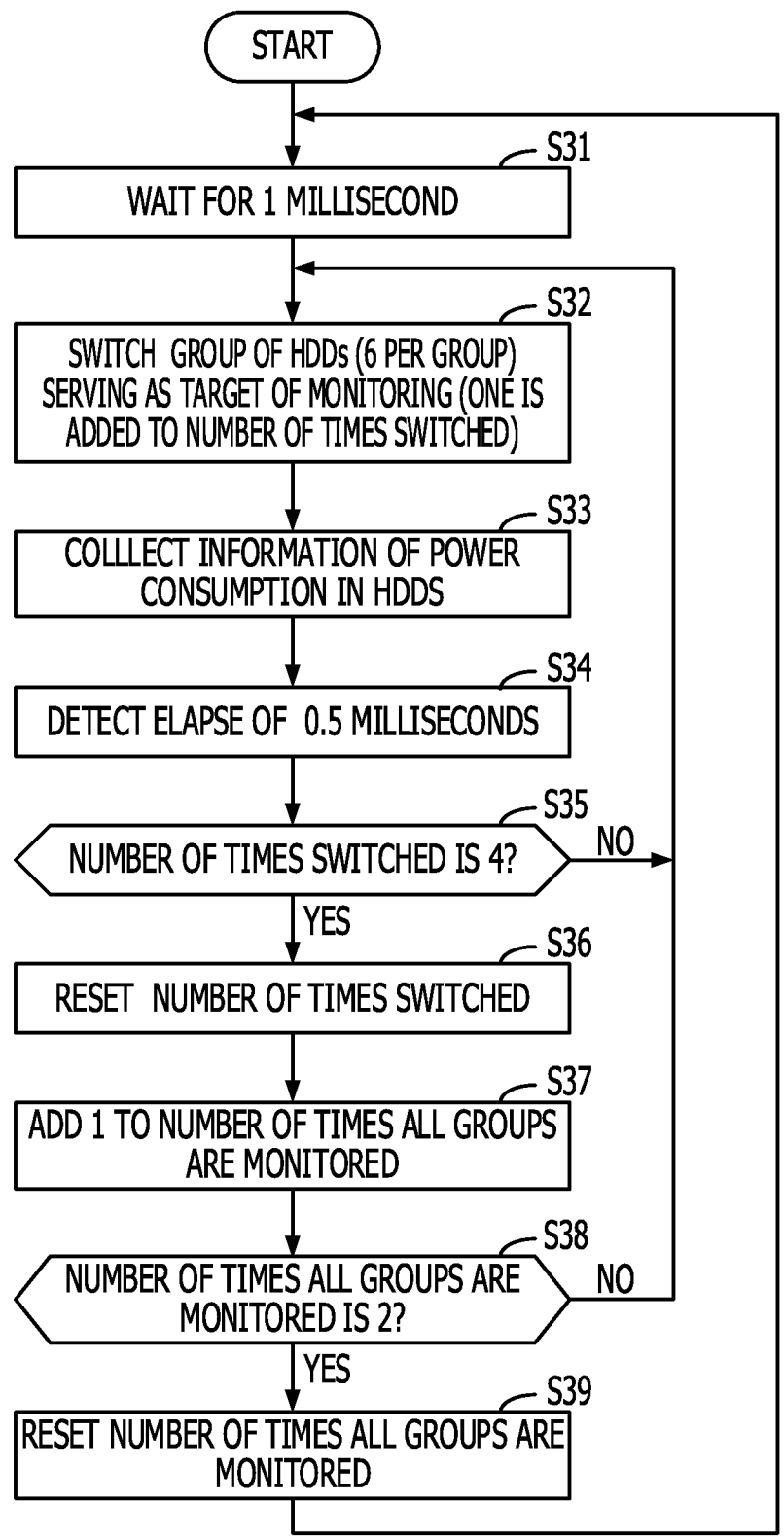
FIG. 12 is a flowchart illustrating an example of monitoring (for each HDD) according to a second embodiment.

FIG. 12 is a flowchart illustrating an example of monitoring (for each HDD) according to the second embodiment. Hereinafter, processing illustrated in FIG. 12 will be described in keeping with numbers.

(S31) The monitoring unit 103a waits for one millisecond.

(S32) The monitoring unit 103a switches a monitoring target HDD group. Here, according to the second embodiment, a case is exemplified where the HDDs whose total sum is 24 are housed in the housing unit 102. Therefore, as an example, 6 HDDs are treated as one group. Groups whose total sum is 4 turn out to exist in the CE 100. In this regard, however, the number of HDDs per one group may be arbitrarily determined in accordance with a monitoring interval. For example, when a previous monitoring target is a first HDD group of HDDs indicated by the identifiers of HDD#0 to HDD#5, a present monitoring target is switched to a second HDD group of HDDs indicated by the identifiers of HDD#6 to HDD#11. The monitoring unit 103a adds "1" to the number of times a monitoring target HDD group is switched.

(S33) The monitoring unit 103a collects the information of power consumption measured in the electric power measurement unit 103e with respect to each HDD included in an HDD group serving as a present monitoring target, and stores the information of power consumption in the memory 103b.

(S34) When having detected that 0.5 milliseconds have elapsed from the start of S32, the monitoring unit 103a transfers the processing to S35.

(S35) The monitoring unit 103a determines whether or not the number of times a monitoring target HDD group is switched is "4". When the number of times a monitoring target HDD group is switched is "4", the processing is transferred to S36. When the number of times a monitoring target HDD group is switched is not "4", the processing is transferred to S32.

(S36) The monitoring unit 103a resets, to "0", the number of times a monitoring target HDD group is switched.

(S37) The monitoring unit 103a adds "1" to the number of times all monitoring target HDD groups (all the groups whose total sum is "4") are monitored.

(S38) The monitoring unit 103a determines whether or not the number of times all monitoring target HDD groups are monitored is "2". When the number of times all monitoring target HDD groups are monitored is "2", the processing is transferred to S39. When the number of times all monitoring target HDD groups are monitored is not "2", the processing is transferred to S32.

(S39) The monitoring unit 103a resets, to "0", the number of times all monitoring target HDD groups are monitored. Thereafter, the processing is transferred to S31.

By executing the above-mentioned procedure with the period of 5 milliseconds, the monitoring unit 103a continuously collects the information of power consumption in for each HDD, from the electric power measurement unit 103e. In S33, the monitoring unit 103a may convert, to power consumption in an alternating current, the power consumption collected from the electric power measurement unit 103e. The reason is similar to S13.

The monitoring unit 103a performs the procedures in FIG. 10 to FIG. 12 in parallel. S11, S21, and S31 are the same operation described as divided into three, for convenience, and therefore, the execution timings thereof are equal to one another.

FIG. 13 is a diagram illustrating an example of switching a monitoring target in one cycle according to the second embodiment. As described above, one cycle is 10 milliseconds. In the monitoring of power consumption for the CE, power consumption is collected while switching a monitoring target between the PSU 106 side and the PSU 107 side every 5 milliseconds (0.5 cycles). The breakdown of 5 milliseconds indicates that a measurement time is 4 milliseconds and a time taken for writing data (flash write) to the memory 103b is 1 millisecond. 10 milliseconds (one cycle) are taken to collect the information of power consumption from both of the electric power measurement units 103c and 103d. A value obtained by summing the power consumption individually measured in the electric power measurement units 103c and 103d turns out to be power consumption for the CE.

In the monitoring of power consumption for each CM, both of the CMs 104 and 105 are targeted for the collection of power consumption, within 5 milliseconds (0.5 cycles). A measurement time for this purpose is 4 milliseconds (2 milliseconds are taken for measuring in the electric power measurement unit 103f and 2 milliseconds are taken for measuring in the electric power measurement unit 103g). A time taken to write data to the memory 103b is 1 millisecond. Within 10 milliseconds (1 cycle), it may be possible to collect the information of power consumption twice with respect to each of the CMs 104 and 105.

In the monitoring of power consumption for each HDD, all of the 24 HDDs are targeted for the collection of power consumption, within 5 milliseconds (0.5 cycles). A measurement time for this purpose is 4 milliseconds. A time taken to write data to the memory 103b is 1 millisecond. In FIG. 13, the identifiers of the groups of HDDs are expressed as HDD#G0, HDD#G1, HDD#G2, and HDD#G3. For example, the HDD#G0 is a group including the HDD#0 to the HDD#5. The HDD#G1 is a group including the HDD#6 to the HDD#11. The HDD#G2 is a group including the HDD#12 to the HDD#17. The HDD#G3 is a group including the HDD#18 to the HDD#23. Out of the measurement time of 4 milliseconds, a measurement time per one group with respect to single measurement is 0.5 milliseconds. Accordingly, it may be possible to collect the information of power consumption twice with respect to each HDD within 5 milliseconds (0.5 cycles). Within 10 milliseconds (1 cycle), it may be possible to collect the information of power consumption four times with respect to each HDD.

When obtaining the information of power consumption a plurality of times within one cycle, the monitoring unit 103a defines the average of power consumption obtained a plurality of times within the one cycle, as the power consumption of the one cycle. For example, since it is possible to obtain power consumption twice per one cycle with respect to the CM 104, the average of the power consumption obtained twice is defined as power consumption of the one cycle. In addition, for example, since it is possible to obtain power consumption four times per one cycle with respect to one HDD, the average of the power consumption obtained four times is defined as power consumption of the one cycle.

Figure 14:
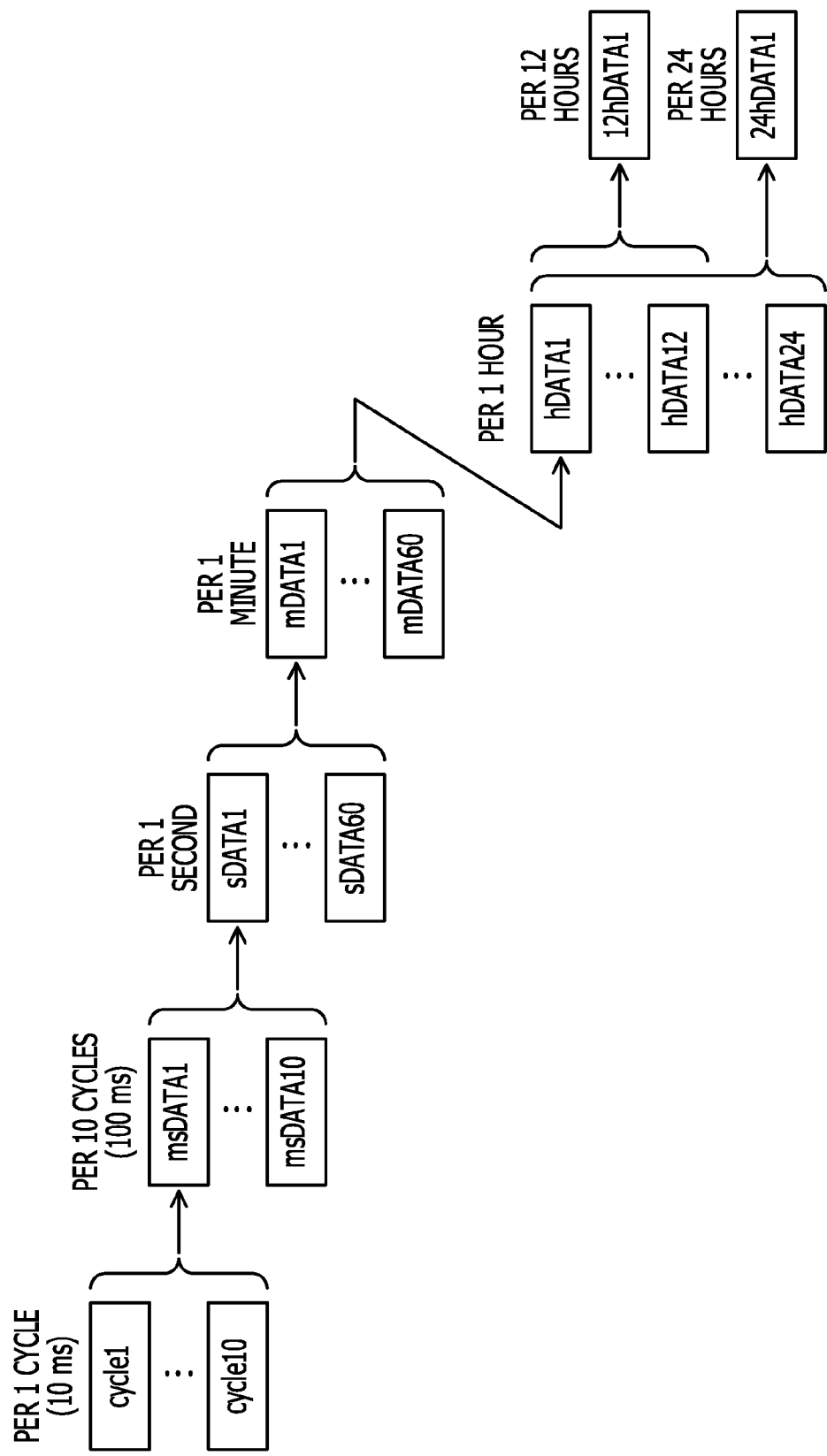
FIG. 14 is a diagram illustrating an example of aggregate calculation of power consumption according to a second embodiment.

FIG. 14 is a diagram illustrating an example of the aggregate calculation of power consumption according to the second embodiment. Using 10 successive pieces of the information of power consumption per one cycle (10 milliseconds), the monitoring unit 103a calculates average power consumption, and hence, generates the information of power consumption per 10 cycles (100 milliseconds). For example, pieces of the information of power consumption per one cycle are expressed as cycle1, cycle2, . . . . Successive numbers added to the character strings of cycles indicate that the measurement times are succeeding (the same shall apply to power consumption acquired in other time units). Pieces of the information of power consumption per 10 cycles are expressed as msDATA1, msDATA2, . . . . The average of the cycle1, the cycle2, . . . , and the cycle10 is the msDATA1. In the same way, the average of cycle11, cycle12, . . . , and cycle20 is the msDATA2. In this way, the monitoring unit 103a newly calculates msDATA every 10 cycles.

Using 10 successive pieces of the information of power consumption per 10 cycles, the monitoring unit 103a calculates average power consumption, and hence, generates the information of power consumption per 1 second. For example, pieces of the information of power consumption per 1 second are expressed as sDATA1, sDATA2, . . . . The average of the msDATA1, the msDATA2, . . . , and the msDATA10 is the sDATA1. In the same way, the average of the msDATA11, the msDATA12, . . . , and the msDATA20 is the sDATA2. In this way, the monitoring unit 103a newly calculates sDATA every 1 second. The monitoring unit 103a acquires, from the RTC, a time when sDATA has been newly calculated. The monitoring unit 103a registers the acquired time and the new sDATA, in the power consumption table 121 stored in the memory 103b.

Using 60 successive pieces of the information of power consumption per 1 second, the monitoring unit 103a calculates average power consumption, and hence, generates the information of power consumption per 1 minute. For example, pieces of the information of power consumption per 1 minute are expressed as mDATA1, mDATA2, . . . . The average of the sDATA1, the sDATA2, . . . , and the sDATA60 is the mDATA1. In the same way, the average of the sDATA61, the sDATA62, . . . , and the sDATA120 is the mDATA2. In this way, the monitoring unit 103a newly calculates mDATA every 1 minute. The monitoring unit 103a acquires, from the RTC, a time when mDATA has been newly calculated. The monitoring unit 103a registers the acquired time and the new mDATA, in the power consumption table 121 stored in the memory 103b.

Using 60 successive pieces of the information of power consumption per 1 minute, the monitoring unit 103a calculates average power consumption, and hence, generates the information of power consumption per 1 hour. For example, pieces of the information of power consumption per 1 hour are expressed as hDATA1, hDATA2, . . . . The average of the mDATA1, the mDATA2, . . . , and the mDATA60 is the hDATA1. In the same way, the average of the mDATA61, the mDATA62, . . . , and the mDATA120 is the hDATA2. In this way, the monitoring unit 103a newly calculates hDATA every 1 hour. The monitoring unit 103a acquires, from the RTC, a time when hDATA has been newly calculated. The monitoring unit 103a registers the acquired time and the new hDATA, in the power consumption table 121 stored in the memory 103b.

Using 12 successive pieces of the information of power consumption per 1 hour, the monitoring unit 103a calculates average power consumption, and hence, generates the information of power consumption per 12 hours. For example, pieces of the information of power consumption per 12 hours are expressed as 12hDATA1, 12hDATA2, . . . . The average of the hDATA1, the hDATA2, . . . , and the hDATA12 is the 12hDATA1. In the same way, the average of the hDATA13, the hDATA14, . . . , and the hDATA24 is the 12hDATA2. In this way, the monitoring unit 103a newly calculates 12hDATA every 12 hours. The monitoring unit 103a acquires, from the RTC, a time when 12hDATA has been newly calculated. The monitoring unit 103a registers the acquired time and the new 12hDATA, in the power consumption table 121 stored in the memory 103b.

Using 24 successive pieces of the information of power consumption per 1 hour, the monitoring unit 103a calculates average power consumption, and hence, generates the information of power consumption per 24 hours. For example, pieces of the information of power consumption per 24 hours are expressed as 24hDATA1, 24hDATA2, . . . . The average of the hDATA1, the hDATA2, . . . , and the hDATA24 is the 24hDATA1. In the same way, the average of the hDATA25, the hDATA26, . . . , and the hDATA48 is the 24hDATA2. In this way, the monitoring unit 103a newly calculates 24hDATA every 24 hours. The monitoring unit 103a acquires, from the RTC, a time when 24hDATA has been newly calculated. The monitoring unit 103a registers the acquired time and the new 24hDATA, in the power consumption table 121 stored in the memory 103b. The monitoring unit 103a may acquire 24hDATA using two successive pieces of 12hDATA.

When the average of power consumption is calculated per each time period, the average may be calculated with excluding the maximum value and the minimum value of power consumption from the collected samples. The power consumption may be measured as a large value or measured as a small value, in an unexpected fashion, and it is likely that these samples deteriorate the accuracy of power consumption monitoring. By removing this kind of information, it may be possible to improve the accuracy of the measurement of power consumption.

Next, another example of a CE will be described and compared with the CE 100.

Figure 15:
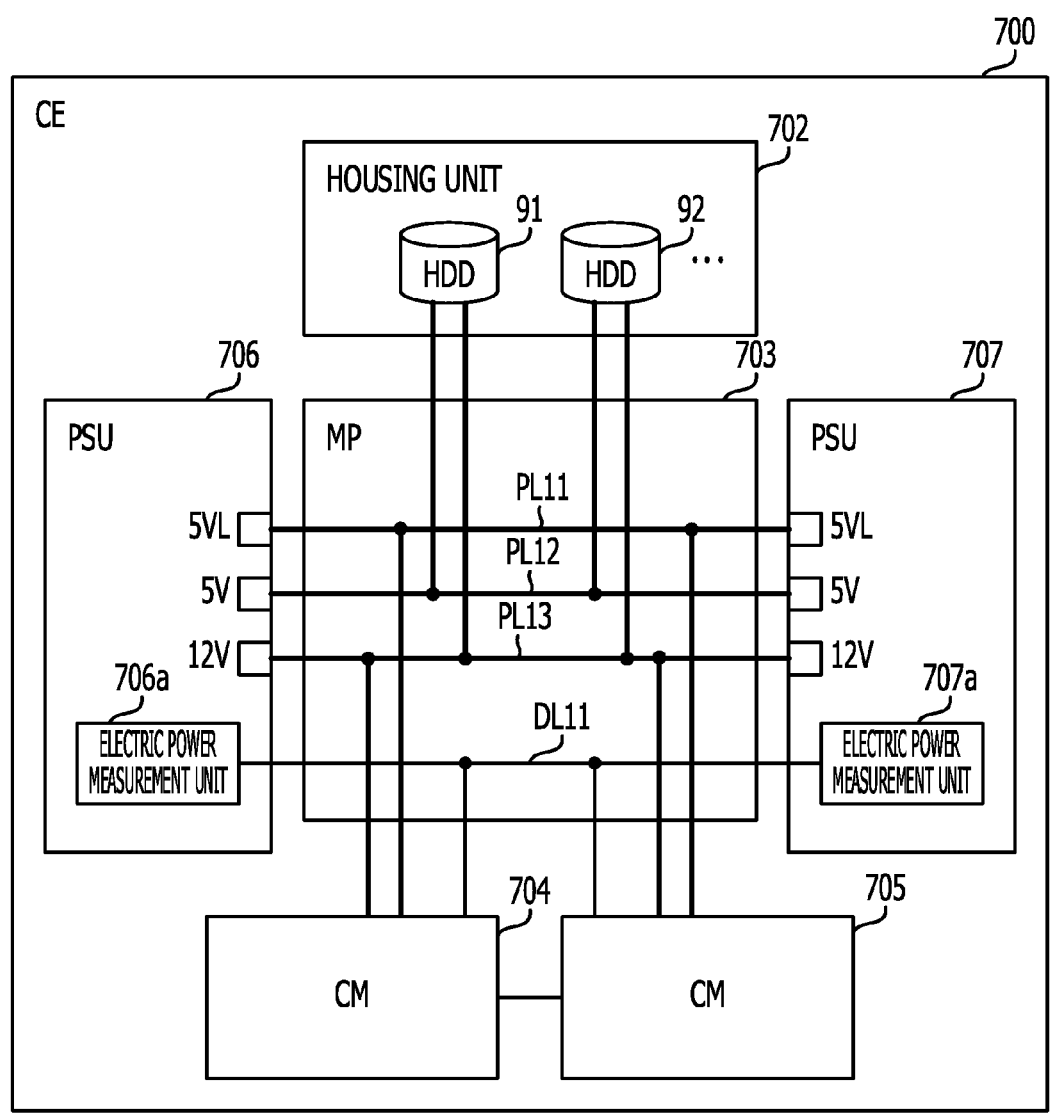
FIG. 15 is a diagram illustrating an example of hardware configuration of a CE.

FIG. 15 is a diagram illustrating another example of a hardware configuration of a CE. A CE 700 includes a housing unit 702, an MP 703, CMs 704 and 705, and PSUs 706 and 707. Each unit included in the CE 700 is similar to each unit included in the CE 100 and having the same name. Therefore, the description of a common subject matter will be omitted, and differences will be described.

The housing unit 702 is similar to the housing unit 102. The housing unit 702 houses HDDs 91, 92, . . . .

The MP 703 includes power supply lines PL11, PL12, and PL13 and a data line DL11. The power supply line PL11 is used for supplying electric power of 5 VL. The power supply line PL12 is used for supplying electric power of 5 V. The power supply line PL13 is used for supplying electric power of 12 V.

The data line DL11 is used for the input/output of data between the CMs 704 and 705 and the PSUs 706 and 707. In FIG. 15, the illustration of data lines used by the CMs 704 and 705 for accessing the HDDs 91, 92, . . . is omitted.

The CMs 704 and 705 are similar to the CMs 104 and 105. In this regard, however, the CMs 704 and 705 are different from the CMs 104 and 105 in that the information of power consumption is collected from the PSUs 706 and 707.

The PSU 706 includes an electric power measurement unit 706a. By measuring a voltage and a current within the PSU 706, the electric power measurement unit 706a measures power consumption. The electric power measurement unit 706a provides the measured power consumption to the CM 704 (or the CM 705). In the same way, the PSU 707 also includes an electric power measurement unit 707a. In the same way as the electric power measurement unit 706a, by measuring a voltage and a current within the PSU 707, the electric power measurement unit 707a also provides the measured power consumption to the CM 704 (or the CM 705).

The CE 700 is different from the CE 100 in that the electric power measurement units 706a and 707a are provided in the PSUs 706 and 707, respectively. In this case, the electric power measurement unit 706a may measure the output voltage and the output current of the PSU 706. Therefore, the electric power measurement unit 706a may acquire power consumption in terms of the entire CE 700. However, the output of the PSU 706 is branched through the power supply lines PL11, PL12, and PL13, and supplied to each unit within the CE 700. In the electric power measurement unit 706a, while it may be possible to acquire power consumption at a root (within the PSU 706) before branching, it may be difficult to acquire power consumption in a branch destination. The same applies to the electric power measurement unit 707a. Therefore, in the CE 700, it may be difficult to acquire power consumption for each CM and for each HDD.

On the other hand, in the CE 100, the electric power measurement units 103e, 103f, and 103g are provided on the MP 103. For example, the electric power measurement units 103e, 103f, and 103g are provided in lines branched from the power supply lines PL1, PL2, and PL3 to the HDDs 31, 32, . . . , and the CMs 104 and 105. Therefore, it may be possible to individually measure power consumption with respect to the CMs 104 and 105 and each HDD. Accordingly, it may be possible to acquire power consumption in detail with respect to the CE 100.

The monitoring unit 103a may collect and provide power consumption, measured by the electric power measurement units 103e, 103f, and 103g, to the CMs 104 and 105. Therefore, by collecting the corresponding pieces of the information of power consumption from the monitoring unit 103a, it may become possible for the CMs 104 and 105 to easily acquire power consumption in detail within the CE 100. For example, it may also be considered that power consumption is collected and aggregated in the CMs 104 and 105. However, in this case, extra loads such as aggregate calculation occur in the CMs 104 and 105, and may badly influence original processing (for example, data access). On the other hand, according to the second embodiment, since the CMs 104 and 105 may just acquire the information of power consumption aggregated by the monitoring unit 103a, extra loads need not be applied on the CMs 104 and 105.

In addition, the CMs 104 and 105 may acquire pieces of the information of power consumption collected in the DEs 200 and 300, from the DEs 200 and 300. Therefore, in the CE 100, it may be possible to manage the detail of the state of power consumption in the entire storage system in an integrated fashion.

The electric power measurement units 103c, 103d, 103e, 103f, and 103g are provided on the MP 103. Therefore, even if electric power measurement units are not provided in the PSUs 106 and 107 or the like, it may be possible to monitor power consumption in detail. In recent years, the standardization of devices used in storage systems has been argued, and, for example, a standard such as storage bridge bay (SBB) has also been considered. It may also be considered that an electric power measurement function is omitted in a standardized PSU. If the MP 103 is used, it may also be possible to monitor power consumption for the CE, in such a case. In addition to this, it may also become possible to monitor power consumption in detail for each CM and for each HDD.

The same advantage of the CE 100 applies to the DEs 200 and 300. For example, in the DEs 200 and 300, it may be possible to monitor power consumption in detail for the DE, for each IOM, and for each HDD. In addition, it is desirable that an IOM just acquires the information of power consumption aggregated by a monitoring unit, and it may be possible to avoid an extra load applied on the IOM. Furthermore, it may be possible to monitor power consumption for the DE without providing an electric power measurement unit within a PSU.

Third Embodiment

Hereinafter, a third embodiment will be described. A difference with the above-mentioned second embodiment will be mainly described, and the description of a common subject matter will be omitted.

In the description of the second embodiment, a method has been exemplified where power consumption for each CM (or an IOM) and for each HDD are monitored in detail in the CE 100 and DEs 200 and 300. In the description of the third embodiment, a method will be exemplified where the operation modes of the CE 100 and the DEs 200 and 300 are controlled and power saving is achieved, using the information of power consumption acquired in detail.

A storage system (and each device included in the storage system) of the third embodiment is similar to the storage system according to the second embodiment described in FIG. 2. In addition, examples of the hardware configuration and the functional configuration of a CE and a DE in the third embodiment are similar to examples of the hardware configuration and the functional configuration of the CE 100 and the DEs 200 and 300 according to the second embodiment described in FIGS. 3A and 3B to FIG. 7. Therefore, the same name/symbol as the second embodiment is assigned to each device in the third embodiment.

The third embodiment is different from the second embodiment in that the management units 110 and 110*a* control the operation modes of the CE 100 and the DEs 200 and 300 on the basis of the power consumption tables 121, 122, and 123 acquired from the monitoring unit 103*a* and the DEs 200 and 300. In this regard, however, it is assumed that one of the management units 110 and 110*a* controls the operation modes and the other thereof is a stand-by system. For example, when the one management unit does not operate owing to a failure or the like, the other management unit performs control as substitute for the one management unit. Hereinafter, it is assumed that the management unit 110 takes a role in the control of the operation modes and the management unit 110*a* is the stand-by system.

Figure 16A:
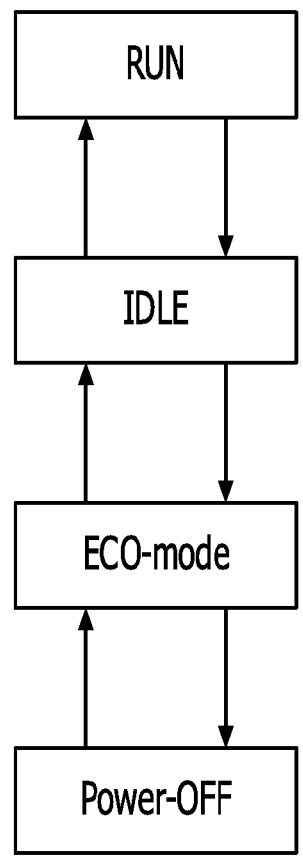
FIG. 16A and FIG. 16B are diagrams illustrating examples of operation modes according to a third embodiment.
Figure 16B:
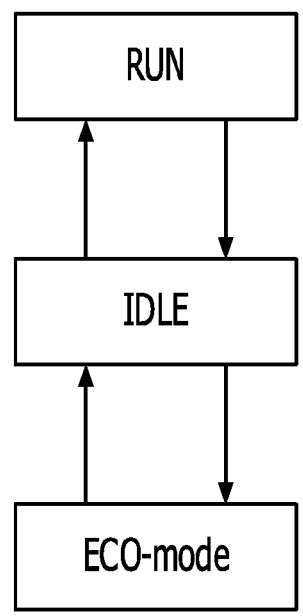

FIG. 16A and FIG. 16B are diagrams illustrating examples of operation modes according to the third embodiment. FIG. 16A exemplifies the operation mode of an HDD. The operation mode of the HDD may be switchable to RUN, IDLE, an ECO-mode, and Power-OFF.

The RUN is an operation mode at the time of a normal operation (a state where data access is steadily performed). In the RUN, electric power is supplied to almost all circuits within the HDD. The IDLE is an operation mode for halting the supply of electric power to a portion of the circuits of the HDD. The number of circuits activated in the IDLE is fewer than the number of circuits activated in the RUN. Therefore, in the IDLE, it may be possible to achieve power saving, compared with the RUN. The ECO-mode is an operation mode for further halting the rotation of a magnetic disk from the mode of the IDLE. In the ECO-mode, it may be possible to achieve power saving, compared with the IDLE. The Power-OFF is a mode where the supply of electric power to the HDD is halted. In the Power-OFF, it may be possible to achieve power saving, compared with the ECO-mode.

On the basis of an input/output (IO) load on an HDD and the power consumption of the HDD, the management unit 110 causes the operation mode of the HDD to transit from the RUN to the IDLE, from the IDLE to the ECO-mode, or from the ECO-mode to the Power-OFF. In addition, on the basis of an IO load on an HDD, the management unit 110 causes the operation mode of the HDD to transit from an operation mode other than the RUN to the RUN.

The IO load of an HDD is measured with respect to each HDD. The IO load of each HDD is measurable in interfaces included in the CMs 104 and 105 so as to access HDDs. For example, it is assumed that the IO load is defined as a percentage (IO load factor) indicating how large a used bandwidth is within a communication band available for a corresponding interface to communicate with an HDD. For example, the management unit 110 acquires the IO load factor measured for each HDD, and uses the acquired IO load factor for controlling the operation mode of each HDD. Specifically, the management unit 110 controls the operation mode of an HDD in the following way.

When the operation mode of an HDD is the RUN, in a case where a state, in which there is no increase in the IO load factor and the power consumption of the HDD, has continued for a predetermined time, the operation mode of the HDD is caused to transit from the RUN to the IDLE.

When the operation mode of an HDD is the IDLE, in a case where a state, in which there is no increase in the IO load factor and the power consumption of the HDD, has continued for a predetermined time, the operation mode of the HDD is caused to transit from the IDLE to the ECO-mode.

When the operation mode of an HDD is the ECO-mode, in a case where a state, in which there is no increase in the IO load factor and the power consumption of the HDD, has continued for a predetermined time, the operation mode of the HDD is caused to transit from the ECO-mode to the Power-OFF.

When the operation mode of an HDD is the IDLE, in a case where there has been an increase in the IO load factor of the HDD, the operation mode of the HDD is caused to transit from the IDLE to the RUN.

When the operation mode of an HDD is the ECO-mode, in a case where there has been an increase in the IO load factor of the HDD, the operation mode of the HDD is caused to transit from the ECO-mode to the RUN (through the IDLE).

When the operation mode of an HDD is the Power-OFF, in a case where there has been an increase in the IO load factor of the HDD, the operation mode of the HDD is caused to transit from the Power-OFF to the RUN (through the ECO-mode and the IDLE).

FIG. 16B exemplifies the operation mode of the CM 104. The same applies to the CM 105 and the IOMs 204 and 205. The operation mode of the CM 104 may be switchable to RUN, IDLE, and an ECO-mode. The RUN is an operation mode at the time of a normal operation. In the RUN, electric power is supplied to almost all circuits within the CM 104.

The IDLE is an operation mode for halting the supply of electric power to a portion of the circuits of the CM 104. The number of circuits activated in the IDLE is fewer than the number of circuits activated in the RUN. Therefore, in the IDLE, it may be possible to achieve power saving, compared with the RUN. The ECO-mode is an operation mode for further reducing the number of target circuits for power supply from the mode of the IDLE. In the ECO-mode, it may be possible to achieve power saving, compared with the IDLE. In the case of any one of the IDLE and ECO-mode, electric power for causing the management unit 110 to operate is still supplied.

On the basis of an IO load between the CM 104 and the application server 500 and the power consumption of the CM 104, the management unit 110 causes the operation mode of the CM 104 to transit from the RUN to the IDLE or from the IDLE to the ECO-mode. In addition, on the basis of the IO load between the CM 104 and the application server 500, the management unit 110 causes the operation mode of the CM 104 to transit from an operation mode other than the RUN to the RUN.

The IO load between the CM 104 and the application server 500 is measurable in the CA 104d. For example, it is assumed that the IO load is defined as a percentage (IO load factor) indicating how large a used bandwidth is within a communication band available for the CA 104d. For example, the management unit 110 acquires the IO load factor measured in the CA 104d, and uses the acquired IO load factor for controlling the operation mode of the CM 104. Specifically, the management unit 110 controls the operation mode of the CM 104 in the following way.

When the operation mode of the CM 104 is the RUN, in a case where a state, in which there is no increase in the IO load factor between the CM 104 and the application server 500 and the power consumption of the CM 104, has continued for a predetermined time, the operation mode of the CM 104 is caused to transit from the RUN to the IDLE.

When the operation mode of the CM 104 is the IDLE, in a case where a state, in which there is no increase in the IO load factor between the CM 104 and the application server 500 and the power consumption of the CM 104, has continued for a predetermined time, the operation mode of the CM 104 is caused to transit from the IDLE to the ECO-mode.

When the operation mode of the CM 104 is the IDLE, in a case where there has been an increase in the IO load factor between the CM 104 and the application server 500, the operation mode of the CM 104 is caused to transit from the IDLE to the RUN.

When the operation mode of the CM 104 is the ECO-mode, in a case where there has been an increase in the IO load factor between the CM 104 and the application server 500, the operation mode of the CM 104 is caused to transit from the ECO-mode to the RUN (through the IDLE).

FIG. 17 is a diagram illustrating an example of an operation mode threshold value table according to the third embodiment. An operation mode threshold value table 124 is preliminarily stored in the memory units 120 and 120a. The operation mode threshold value table 124 is information used for identifying the present operation mode of each HDD or a CM (or an IOM) by the management unit 110. The operation mode threshold value table 124 includes items of a "classification", an "operation mode", an "IO load factor", and "power consumption".

In the "classification" item, a type of a corresponding device is registered. In the "operation mode" item, information indicating an operation mode is registered. In the "IO load factor" item, an IO load factor is registered that serves as a reference threshold value to determine as being in the corresponding operation mode. Even if in the IDLE or the ECO-mode, an IO used by the CM 104 for monitoring the state of an HDD or the like may occur in some cases. In the "power consumption" item, the value of power consumption is registered that serves as a reference threshold value to determine as being in the corresponding operation mode.

For example, in the operation mode threshold value table 124, information is registered where the classification is "HDD", the operation mode is "RUN", the IO load factor is "12% or more", and the power consumption is "7.0 W or more". This indicates that, at the time of determining the operation mode of an HDD, when at least one of a condition that the IO load factor of the HDD is 12% or more and a condition that the power consumption of the HDD is 7.0 W or more is satisfied, it may be possible to determine that the operation mode of the HDD is the RUN.

For example, in the operation mode threshold value table 124, information is registered where the classification is "HDD", the operation mode is "IDLE", the IO load factor is "less than 12%", and the power consumption is "4.0 W or more and less than 7.0 W". This indicates that, at the time of determining the operation mode of an HDD, when the IO load factor of the HDD is less than 12% and the power consumption of the HDD is 4.0 W or more and less than 7.0 W, it may be possible to determine that the operation mode of the HDD is the IDLE.

Here, determining as being in the RUN, for example, depends whether or not at least one of the condition regarding the IO load factor and the condition regarding the power consumption is satisfied (the same applies to the case of determining as in the RUN of a CM or an IOM). On the other hand, determining as being in the IDLE, the ECO-mode, or the Power-OFF, for example, depends whether or not both of the condition regarding the IO load factor and the condition regarding the power consumption are satisfied (the same applies to the case of determining as in the IDLE or the ECO-mode of a CM or an IOM).

In addition, for example, in the operation mode threshold value table 124, information is registered where the classification is "CM (IOM)", the operation mode is "RUN", the IO load factor is "5% or more", and the power consumption is "25 W or more". This indicates that, at the time of determining the operation mode of the CM 104, when at least one of a condition that the IO load factor between the CM 104 and the application server 500 is 5% or more and a condition that the power consumption of the CM 104 is 25 W or more is satisfied, it may be possible to determine that the operation mode of the CM 104 is the RUN.

For example, in the operation mode threshold value table 124, information is registered where the classification is "CM (IOM)", the operation mode is "IDLE", the IO load factor is "less than 5%", and the power consumption is "10 W or more and less than 25 W". This indicates that, at the time of determining the operation mode of the CM 104, when the IO load factor between the CM 104 and the application server 500 is less than 5% and the power consumption of the CM 104 is 10 W or more and less than 25 W, it may be possible to determine that the operation mode of the CM 104 is the IDLE.

While, in the above-mentioned description, the CM 104 has been exemplified, it may be possible to determine the operation modes of the CM 105 and the IOMs 204 and 205 in the same way as the CM 104. For example, from the CM 105 and the IOMs 204 and 205, the management unit 110 also collects IO load factors for HDDs handled by each module and an IO load factor from the application server 500. On the basis of the collected information, the management unit 110 may understand the operation modes of the CM 105 and the IOMs 204 and 205.

Next, a procedure will be described that is performed in the CE 100 when an operation mode is changed with a focus on one HDD. The management unit 110 may execute, when changing operation modes of a plurality of HDDs, the following procedure with respect to each HDD.

Figure 18:
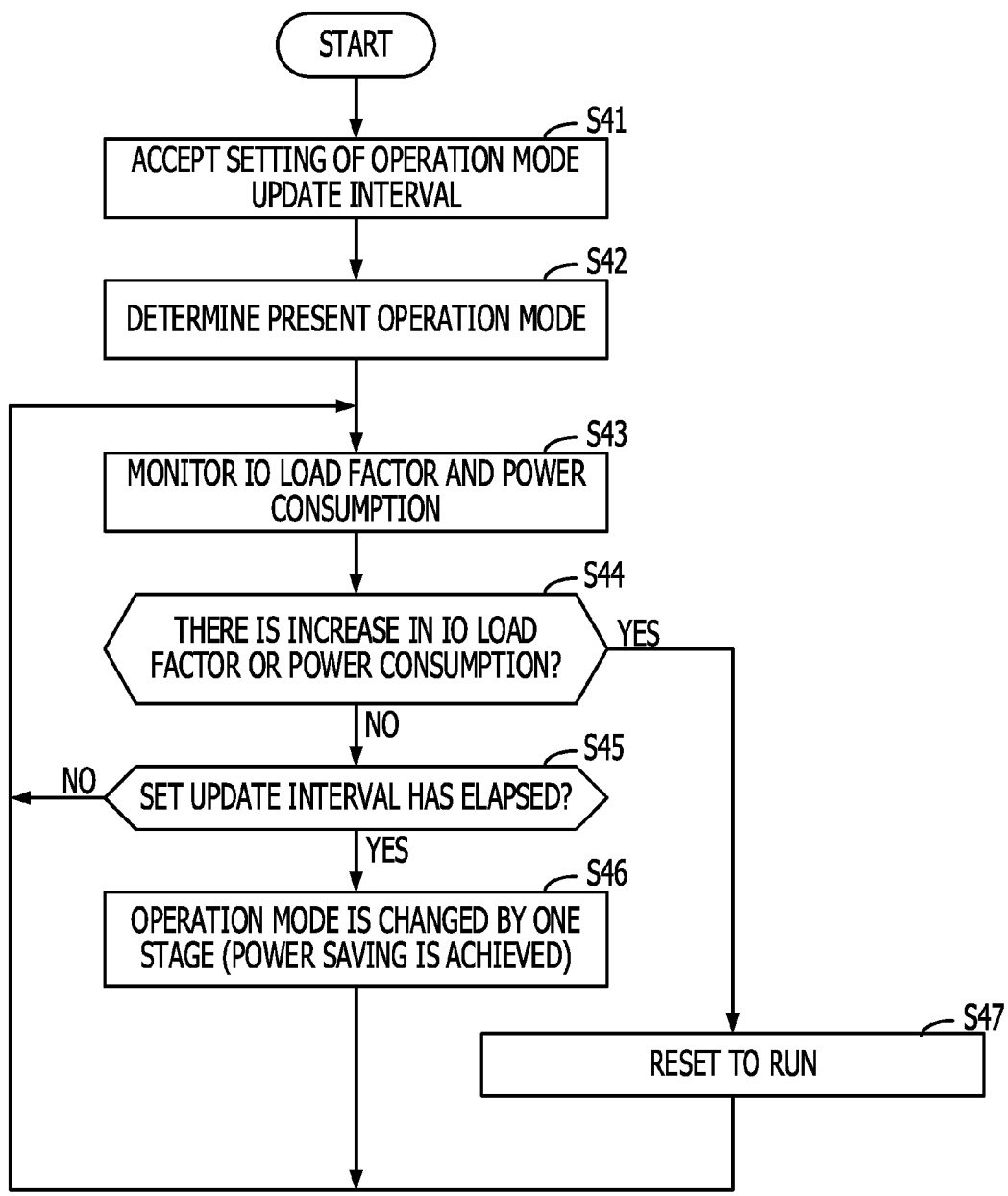
FIG. 18 is a flowchart illustrating an example of changing an operation mode according to a third embodiment.

FIG. 18 is a flowchart illustrating an example of changing an operation mode according to the third embodiment. Hereinafter, processing illustrated in FIG. 18 will be described in keeping with numbers.

(S41) The management unit 110 accepts the setting of an operation mode update interval. The operation mode update interval is a time period used for monitoring power consumption or the like before the operation mode of a target HDD is changed (in the direction of achieving power saving). For example, the administrator of the storage system may input the operation mode update interval from the operation management server 600 to the CE 100.

(S42) The management unit 110 determines the present operation mode of the target HDD. For example, the management unit 110 determines the present operation mode of the target HDD in the following way. The management unit 110 acquires the present IO load factor of the HDD. A method for acquisition is as described above. In addition, the management unit 110 acquires the information of present power consumption of the corresponding HDD from the monitoring unit 103a. With reference to the operation mode threshold value table 124 stored in the memory unit 120, the management unit 110 determines which condition of an operation mode the acquired IO load factor and power consumption satisfy, and hence, the management unit 110 determines the present operation mode of the HDD. Alternatively, the present operation mode may be determined by sampling the IO load factor and the power consumption (described later).

(S43) The management unit 110 acquires the IO load factor of the target HDD and the power consumption of the HDD, and stores the acquired IO load factor and power consumption in the memory unit 120. A method for acquiring the IO load factor and the power consumption is similar to in S42. The management unit 110 records the information of power consumption acquired from the monitoring unit 103a, in the power consumption table 121 stored in the memory unit 120.

(S44) The management unit 110 determines whether or not the IO load factor or the power consumption of the target HDD have increased compared with those at the time of previous acquisition. When both of the IO load factor and the power consumption of the HDD have not increased, the processing is transferred to S45. When the IO load factor or the power consumption of the HDD has increased, the processing is transferred to S47.

(S45) The management unit 110 determines whether or not the time of the operation mode update interval has elapsed from the time point of the completion of S42 or a time point when the time of the operation mode update interval had elapsed last time. When the time of the operation mode update interval has elapsed, the processing is transferred to S46. When the time of the operation mode update interval has not elapsed, the processing is transferred to S43.

(S46) The management unit 110 changes the operation mode of the target HDD by one stage in the direction of achieving power saving. For example, when the operation mode of the HDD is the RUN, the operation mode of the HDD is changed to the IDLE. When the operation mode of the HDD is the IDLE, the operation mode of the HDD is changed to the ECO-mode. When the operation mode of the HDD is the ECO-mode, the operation mode of the HDD is changed to the Power-OFF.

(S47) The management unit 110 resets the operation mode of the target HDD to the RUN. When the operation mode of the HDD is the RUN, the mode is maintained.

In this way, the management unit 110 acquires the IO load factor and the power consumption with respect to each HDD, and changes the operation mode of each HDD.

Here, in S42, the present operation mode may be determined by sampling the IO load factor and the power consumption of the HDD. For example, the values (sampling values) of the sampled IO load factor and power consumption are acquired for a predetermined time period (for example, the time of the operation mode update interval), and the operation mode is determined on the basis of the acquired sampling values. For example, the operation mode of the HDD may be defined as, from among individual operation modes set in the operation mode threshold value table 124, an operation mode having a condition satisfied by the largest number of sampling values. For example, if, from among the plural sampling values, the number of sampling values included in the range (the IO load factor is less than 12% and the power consumption is 4.0 W or more and less than 7.0 W) of the IDLE is the largest, the operation mode of the HDD is determined as the IDLE. When an initial operation mode is determined in this way, the accuracy of the identification of the operation mode may be enhanced, compared with a case where the operation mode is determined using an instantaneous IO load factor and instantaneous power consumption.

While the operation mode is reset to the RUN in S47, the management unit 110 may change the mode to a mode other than the RUN. For example, in S44, even if there is increase in the IO load factor or the power consumption in the case of the ECO-mode, the condition (12% or more) regarding the IO load factor of the RUN or the condition (7.0 W or more) regarding the power consumption of the RUN may be unsatisfied. In that case, the management unit 110 may change the mode to the IDLE. When the condition regarding the IO load factor or power consumption of the RUN is not satisfied, it may be considered that a load has just temporarily increased owing to a pilot access. In that case, if the mode is changed to the IDLE, it may be possible to achieve power saving, compared with a case of being changed to the RUN.

With the similar procedure in FIG. 18, the management unit 110 may control the operation modes of the CMs 104 and 105. For example, in the case of the CM 104, in the description of FIG. 18, "the IO load factor of the HDD" may be deemed to be replaced with "the IO load factor between the CM 104 and the application server". In addition, since the operation mode of the CM 104 does not include the Power-OFF, a change from the ECO-mode to the Power-OFF is not performed. The same applies to the CM 105. Furthermore, as for the DEs 200 and 300, the management unit 110 may control the operation modes of the individual HDDs and IOMs with the similar procedure.

As for the DE 200, the change of the operation mode may be controlled by the management unit 210 (or the management unit 210a). In the same way, as for the DE 300, the change of the operation mode may be controlled by a management unit in the DE 300.

FIG. 19 is a diagram illustrating an example of a power consumption comparison table according to the third embodiment. A power consumption comparison table 800 is a table used for comparing power consumption before and after the change of the operation mode according to the third embodiment is performed with respect to the CE 100. The power consumption comparison table 800 includes items of a "device", a "classification", a "number", an "IO load factor" (the unit is %), a "power consumption" (the unit is W), a "present operation mode", a "changed operation mode", and a "changed power consumption" (the unit is W).

In the "device" item, information indicating a device (here the CE 100) is described. In the "classification" item, information indicating whether it is an HDD or a CM is described. In the "number" item, information used for identifying individual HDDs and individual CMs is described. In the "IO load factor" item, a present IO load factor is described. In the "power consumption" item, present power consumption is described. In the "present operation mode" item, a present operation mode is described. In the "changed operation mode" item, an operation mode after the change is described. In the "changed power consumption" item, power consumption after the change is described. In addition, in the lowest tier of the power consumption comparison table 800, the item of a "sum total" is provided, and the sum total of the power consumption of individual units before the change of the operation mode and the sum total of the power consumption of the individual units after the change of the operation mode are described. In a place where no information is to be described, "-" (hyphen) is described.

For example, in the power consumption comparison table 800, it is indicated that, with respect to the HDD 31 indicated by the HDD#0, the IO load factor is 75%, the power consumption is 8.1 W, and the present operation mode is the RUN. In the HDD 31, access is frequently performed, and the RUN is maintained afterward. Therefore, as for the HDD 31, the present operation mode and the changed operation mode are the same (RUN). Power consumption after the change is also the same as before the change. The HDD 32 (the HDD of the HDD#1) is similar to the HDD 31.

In the power consumption comparison table 800, it is indicated that, with respect to the HDD of the HDD#6, the IO load factor is 10%, the power consumption is 5.0 W, and the present operation mode is the IDLE. Since, in the HDD, this state has continued for the operation mode update interval, the operation mode is changed from the IDLE to the ECO-mode. Therefore, the power consumption of the HDD is reduced from 5.0 W to 2.0 W. The same applies to the HDD of the HDD#7.

In the power consumption comparison table 800, it is indicated that, with respect to the HDD of the HDD#15, the IO load factor is 5%, the power consumption is 2.0 W, and the present operation mode is the ECO-mode. Since, in the HDD, this state has continued for the operation mode update interval, the operation mode is changed from the ECO-mode to the Power-OFF. Therefore, the power consumption of the HDD is reduced from 2.0 W to 0 W. The same applies to the HDD of the HDD#16.

In the power consumption comparison table 800, it is indicated that, with respect to the CM 104 indicated by the MOD#0, the IO load factor with the application server 500 is 50%, the power consumption is 30 W, and the present operation mode is the RUN. The CM 104 is frequently used, and the RUN is maintained afterward. Therefore, as for the CM 104, the present operation mode and the changed operation mode are the same (RUN). Power consumption after the change is also the same as before the change.

In the power consumption comparison table 800, it is indicated that, with respect to the CM 105 indicated by the MOD#1, the IO load factor with the application server 500 is 0%, the power consumption is 15 W, and the present operation mode is the IDLE. Since, in the CM 105, this state has continued for the operation mode update interval, the operation mode is changed from the IDLE to the ECO-mode. Therefore, the power consumption of the CM 105 is reduced from 15 W to 10 W.

In this way, the management unit 110 acquires the IO load factor and the power consumption with respect to each of the individual HDDs and the CMs 104 and 105. The management unit 110 controls the operation mode of each of the individual HDDs and the CMs 104 and 105 to achieve power saving. In the example of the power consumption comparison table, while the total value of power consumption has been 150 W in the present operation mode, the total value of power consumption is reduced to 100 W in the operation mode after the change. In this way, the management unit 110 may finely control power saving with respect to each of the individual HDDs and the CMs 104 and 105.

While the CE 100 has been exemplified in the power consumption comparison table 800, it may also be possible to achieve power saving with respect to the DEs 200 and 300 in the same way.

While it has been assumed that the management unit 110 controls the operation mode in the third embodiment, an ASIC or an FPGA (a management unit corresponding to the management unit 110) including the corresponding function for controlling the operation mode may be provided on the MP 103. In that case, in the MP 103, for example, information corresponding to the IO load factor on each HDD and information corresponding to the IO load factor between the CM 104 and the application server 500 are acquired. Since data lines between the CM 104 and the individual HDDs also exist in the MP 103, it may be considered that these pieces of information are acquired by monitoring the bandwidths of the corresponding data lines. The MP 103 may acquire information corresponding to each IO load factor from the CM 104. In this way, it may be possible to reduce the loads of the CMs 104 and 105, associated with the control of the operation modes.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A storage device comprising:
 a first measurement unit to measure electric power consumed in each of a plurality of memory devices;
 a second measurement unit to measure electric power consumed in a control unit controlling access from an information processing apparatus to the plurality of memory devices;
 a collection unit to collect first information regarding the electric power measured by the first measurement unit and second information regarding the electric power measured by the second measurement unit; and
 a management unit to change an operation mode of a first memory device from among the plurality of memory devices from a first mode to a second mode, power consumption of the first memory device in the second mode being lower than power consumption of the first memory device in the first mode, the management unit changing the operation mode of the first memory device from the first mode to the second mode when there is no increase in an input/output load of the first memory device and when there is no increase in the measured electric power consumed in the first memory device for a predetermined period of time.

2. The storage device according to claim 1, further comprising:
 a connection unit to connect the plurality of memory devices with the control unit, wherein the first measurement unit, the second measurement unit, and the collection unit are provided in the connection unit.

3. The storage device according to claim 1, wherein the collection unit
individually aggregates the first information and the second information, and
provides the aggregated first information and the aggregated second information to the control unit.

4. A connection device for connecting a plurality of memory devices with a control device controlling access to the plurality of memory devices, the connection device comprising:
a first measurement unit to measure electric power consumed in each of the plurality of memory devices;
a second measurement unit to measure electric power consumed in the control device;
a collection unit to collect
first information regarding the electric power measured by the first measurement unit and
second information regarding the electric power measured by the second measurement unit; and
a management unit to change an operation mode of a first memory device from among the plurality of memory devices from a first mode to a second mode, power consumption of the first memory device in the second mode being lower than power consumption of the first memory device in the first mode, the management unit changing the operation mode of the first memory device from the first mode to the second mode when there is no increase in an input/output load of the first memory device and when there is no increase in the measured electric power consumed in the first memory device for a predetermined period of time.

5. A storage control method executed by a storage device including a control unit controlling access to a plurality of memory devices, the control method comprising:
measuring electric power consumed in each of the plurality of memory devices;
measuring electric power consumed in the control unit;
collecting information of the measured electric power consumed in each of the plurality of memory devices and the measured electric power consumed in the control unit; and
changing an operation mode of a first memory device from among the plurality of memory devices from a first mode to a second mode, power consumption of the first memory device in the second mode being lower than power consumption of the first memory device in the first mode, when there is no increase in an input/output load of the first memory device and when there is no increase in the measured electric power consumed in the first memory device for a predetermined period of time.

* * * * *